US012604586B2

(12) United States Patent
Cheon et al.

(10) Patent No.: US 12,604,586 B2
(45) Date of Patent: Apr. 14, 2026

(54) DISPLAY APPARATUS

(71) Applicant: Samsung Display Co., Ltd., Yongin-si (KR)

(72) Inventors: Soohong Cheon, Yongin-si (KR); Sunkwang Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 480 days.

(21) Appl. No.: 18/319,336

(22) Filed: May 17, 2023

(65) Prior Publication Data

US 2023/0402579 A1 Dec. 14, 2023

(30) Foreign Application Priority Data

Jun. 8, 2022 (KR) ........................ 10-2022-0069574

(51) Int. Cl.
H10H 20/857 (2025.01)
H01L 25/075 (2006.01)
(Continued)

(52) U.S. Cl.
CPC ....... H10H 20/857 (2025.01); H01L 25/0753 (2013.01); H01L 25/167 (2013.01); H10D 86/441 (2025.01); H10D 86/60 (2025.01)

(58) Field of Classification Search
CPC . H10H 20/857; H01L 25/0753; H01L 25/167; H10D 86/441; H10D 86/60; H10D 86/481; G09G 2300/0413; G09G 2300/0426; G09G 2310/0262; G09G 3/3233; H10K 59/131; H10K 59/88; H10K 59/124
See application file for complete search history.

(56) References Cited

U.S. PATENT DOCUMENTS

| 8,928,597 B2 | 1/2015 | Jang |
| 9,711,752 B2 | 7/2017 | Lee et al. |
| | (Continued) | |

FOREIGN PATENT DOCUMENTS

| KR | 10-2007-0034391 A | 3/2007 |
| KR | 10-2016-0084006 A | 7/2016 |
| | (Continued) | |

OTHER PUBLICATIONS

English Machine Translation of Park et al KR 20220096889 (Year: 2025).*

*Primary Examiner* — Donald L Raleigh
(74) *Attorney, Agent, or Firm* — Womble Bond Dickinson (US) LLP

(57) ABSTRACT

A display apparatus includes: a substrate including a display area and a peripheral area outside the display area; a driving voltage input unit in the peripheral area; a common voltage input unit in the peripheral area and spaced apart from the driving voltage input unit; a signal wiring portion including a plurality of fan-out wirings that overlap the driving voltage input unit and the common voltage input unit; a first dummy wiring portion outside the signal wiring portion and including a plurality of first dummy wirings that overlap the driving voltage input unit; and a second dummy wiring portion outside the signal wiring portion and including a plurality of second dummy wirings that overlap the common voltage input unit.

20 Claims, 15 Drawing Sheets

(51) Int. Cl.
  *H01L 25/16* (2023.01)
  *H10D 86/40* (2025.01)
  *H10D 86/60* (2025.01)

(56) References Cited

U.S. PATENT DOCUMENTS

| | | |
|---|---|---|
| 2007/0083784 A1 | 4/2007 | Park et al. |
| 2016/0197127 A1 | 7/2016 | Park et al. |
| 2017/0288008 A1 | 10/2017 | Kim et al. |
| 2018/0158837 A1 | 6/2018 | Lee et al. |
| 2018/0211982 A1 | 7/2018 | Wang et al. |
| 2018/0301520 A1 | 10/2018 | Jin et al. |
| 2020/0161411 A1 | 5/2020 | Lee et al. |
| 2020/0373375 A1 | 11/2020 | Na et al. |
| 2021/0202630 A1 | 7/2021 | Jeon et al. |

FOREIGN PATENT DOCUMENTS

| | | | | |
|---|---|---|---|---|
| KR | 10-2017-0114027 A | 10/2017 | | |
| KR | 10-2018-0063931 A | 6/2018 | | |
| KR | 10-2018-0066306 A | 6/2018 | | |
| KR | 10-2018-0115395 A | 10/2018 | | |
| KR | 10-2020-0133890 A | 12/2020 | | |
| KR | 10-2021-0086281 A | 7/2021 | | |
| KR | 20220096889 A | * 7/2022 | ........... | G09F 9/3026 |

* cited by examiner

DISPLAY APPARATUS

CROSS-REFERENCE TO RELATED APPLICATION

The present application claims priority to and the benefit of Korean Patent Application No. 10-2022-0069574, filed on Jun. 8, 2022, in the Korean Intellectual Property Office, the entire disclosure of which is incorporated herein by reference.

BACKGROUND

1. Field

Aspects of one or more embodiments relate to a display apparatus.

2. Description of the Related Art

Generally, in a display apparatus such as an organic light-emitting display apparatus, transistors are arranged in a display area to control characteristics, such as brightness, emission, and the like of a light-emitting diode. The transistors may be configured to control a corresponding light-emitting diode to emit light of a preset color by using a data signal, a driving voltage, and a common voltage transferred thereto.

Wirings may be located in a peripheral area outside the display area, wherein the wirings are configured to transfer electrical signals to be applied to light-emitting diodes or transistors located inside the display area. To determine defects in the wirings, an automatic optical inspection that uses a vision camera may be performed.

The above information disclosed in this Background section is only for enhancement of understanding of the background and therefore the information discussed in this Background section does not necessarily constitute prior art.

SUMMARY

In a display apparatus according some systems, because wirings included in different layers of a display apparatus may overlap each other and a difference in shading may occur due to overlapping wirings, detection errors may occur in an automatic optical inspection operation.

One or more embodiments according to the present disclosure may include a display apparatus including a dummy wiring structure configured to reduce a detection error occurring in an automatic optical inspection operation. However, such a technical problem is an example, and embodiments according to the present disclosure are not limited thereto.

Additional aspects will be set forth in part in the description which follows and, in part, will be apparent from the description, or may be learned by practice of the presented embodiments of the disclosure.

According to one or more embodiments, a display apparatus includes a substrate including a display area and a peripheral area outside the display area, a driving voltage input unit arranged in the peripheral area, a common voltage input unit arranged in the peripheral area and arranged to be apart from the driving voltage input unit, a signal wiring portion including a plurality of fan-out wirings that overlap the driving voltage input unit and the common voltage input unit, a first dummy wiring portion located outside the signal wiring portion and including a plurality of first dummy wirings that overlap the driving voltage input unit, and a second dummy wiring portion located outside the signal wiring portion and including a plurality of second dummy wirings that overlap the common voltage input unit.

According to some embodiments, the first dummy wiring portion may be apart from the second dummy wiring portion.

According to some embodiments, in a plan view, the first dummy wiring portion may be located inside the driving voltage input unit.

According to some embodiments, in a plan view, the second dummy wiring portion may be located inside the common voltage input unit.

According to some embodiments, the plurality of fan-out wirings may be located in a fan-out area, wherein the plurality of fan-out wirings may be apart from each other with a first interval at a first edge of the fan-out area adjacent to the display area, and be apart from each other with a second interval at a second edge facing the first edge, and wherein the first interval may be greater than the second interval.

According to some embodiments, virtual extension lines respectively extending from the plurality of first dummy wirings may be apart from each other with the first interval at the first edge of the fan-out area, and be apart from each other with the second interval at the second edge.

According to some embodiments, virtual extension lines respectively extending from the plurality of second dummy wirings may be apart from each other with the first interval at the first edge of the fan-out area, and be apart from each other with the second interval at the second edge.

According to some embodiments, virtual extension lines respectively extending from the plurality of first dummy wirings may be parallel to a fan-out wiring located in an outermost portion among the plurality of fan-out wirings.

According to some embodiments, virtual extension lines respectively extending from the plurality of first dummy wirings may be apart from each other with an interval equal to or less than the first interval at the first edge of the fan-out area.

According to some embodiments, virtual extension lines respectively extending from the plurality of second dummy wirings may be parallel to a fan-out wiring located in an outermost portion among the plurality of fan-out wirings.

According to some embodiments, virtual extension lines respectively extending from the plurality of second dummy wirings may be apart from each other with an interval equal to or greater than the second interval at the second edge of the fan-out area.

According to some embodiments, the display apparatus may further include a semiconductor layer arranged in the display area, and a buffer layer located under the semiconductor layer, wherein the first dummy wiring portion and the second dummy wiring portion may be located between the substrate and the buffer layer.

According to some embodiments, the display apparatus may further include a semiconductor layer arranged in the display area, a gate insulating layer on the semiconductor layer, and an interlayer insulating layer on the gate insulating layer, wherein the first dummy wiring portion and the second dummy wiring portion may be between the gate insulating layer and the interlayer insulating layer.

According to some embodiments, the first dummy wiring may be electrically connected to the driving voltage input unit.

According to some embodiments, the first dummy wiring may include contact portions on two opposite ends thereof, the contact portions being electrically connected to the driving voltage input unit.

According to some embodiments, the second dummy wiring may be electrically connected to the common voltage input unit.

According to some embodiments, the second dummy wiring may include contact portions on two opposite ends thereof, the contact portions being electrically connected to the driving voltage input unit.

According to some embodiments, the driving voltage input unit and the common voltage input unit may each be provided in plurality, the plurality of driving voltage input units and the plurality of common voltage input units being alternately arranged in a first direction.

According to some embodiments, the first dummy wiring portion may include a (1-1)st dummy wiring portion and a (1-2)nd dummy wiring portion that are symmetrical to each other with respect to a central line of the driving voltage input unit extending in a second direction crossing the first direction.

According to some embodiments, the second dummy wiring portion may include a (2-1)st dummy wiring portion and a (2-2)nd dummy wiring portion that are symmetrical to each other with respect to a central line of the driving voltage input unit extending in a second direction crossing the first direction.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5 is a schematic plan view of a display apparatus according to some embodiments;

FIG. 9 is a schematic plan view of a display apparatus according to some embodiments;

DETAILED DESCRIPTION

Figure 1:
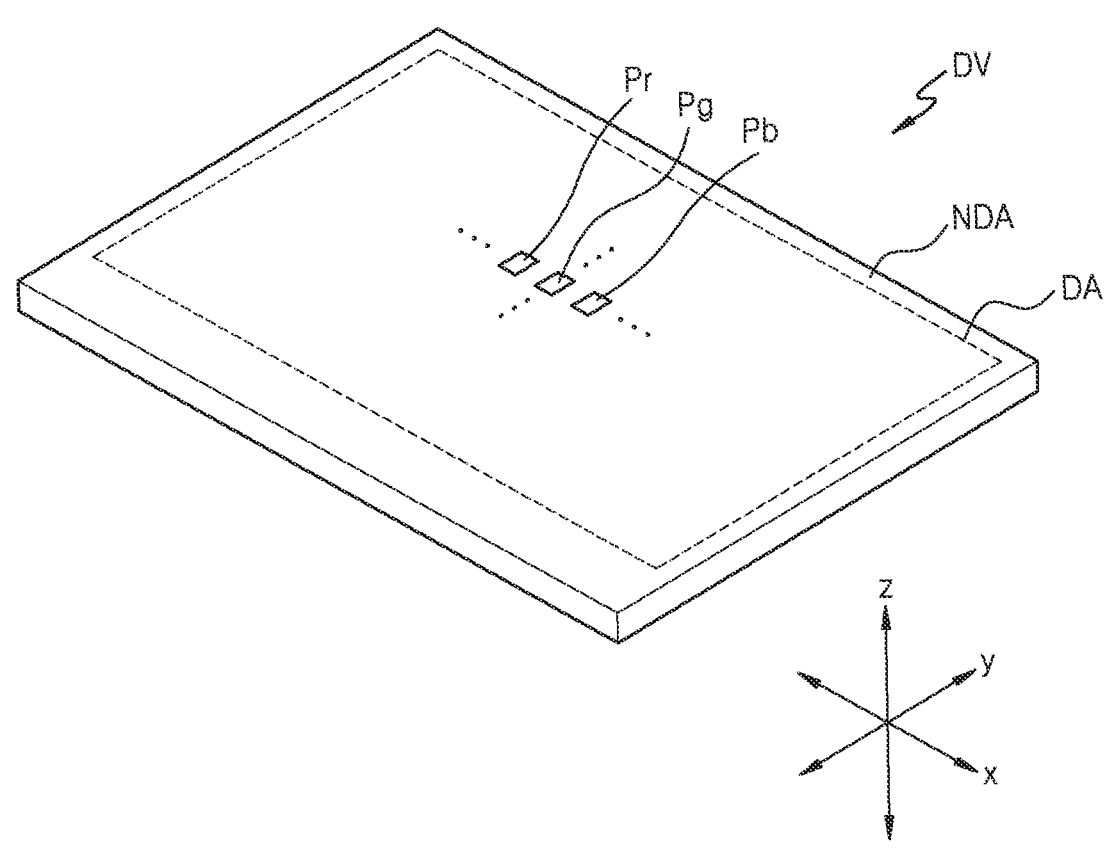
FIG. 1 is a schematic perspective view of a display apparatus according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the present specification, "A and/or B" means A or B, or A and B. In the present specification, "at least one of A and B" means A or B, or A and B.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the case where a certain embodiment may be implemented differently, a specific process order may be performed in the order different from the described order. As an example, two processes successively described may be simultaneously performed substantially and performed in the opposite order.

Sizes of elements in the drawings may be exaggerated or reduced for convenience of explanation. As an example, the size and thickness of each element shown in the drawings are arbitrarily represented for convenience of description, and thus, the present disclosure is not necessarily limited thereto.

FIG. 1 is a schematic perspective view of a display apparatus DV according to some embodiments.

Referring to FIG. 1, the display apparatus DV may include a display area DA, and a non-display area NDA outside the display area DA.

The display apparatus DV may be configured to display images through an array of a plurality of sub-pixels arranged two-dimensionally in a plane of the display area DA. The plurality of sub-pixels may include a red sub-pixel Pr, a green sub-pixel Pg, and a blue sub-pixel Pb. The red sub-pixel Pr, the green sub-pixel Pg, and the blue sub-pixel Pb are regions that may respectively emit red, green, and blue lights. The display apparatus DV may display images by using light emitted from the sub-pixels.

The non-display area NDA is a region that does not display images and may surround the display area DA entirely. A driver or a voltage line configured to provide electrical signals or power to sub-pixel circuits, may be arranged in the non-display area NDA. A pad may be arranged in the non-display area NDA, wherein the pad is a region to which electronic elements or a printed circuit board may be electrically connected.

The display area DA may have a polygonal shape. As an example, as shown in FIG. 1, the display area DA may have a rectangular shape in which a horizontal (e.g., x direction) length thereof is greater than a vertical (e.g., y direction) length thereof. Alternatively, the display area DA may have a rectangular shape in which a horizontal length thereof is less than a vertical length thereof, or have a square shape. Alternatively, the display area DA may have various shapes such as an elliptical shape or a circular shape. Additionally, the z direction can indicate the thickness direction of the display device (DV).

Figure 2:
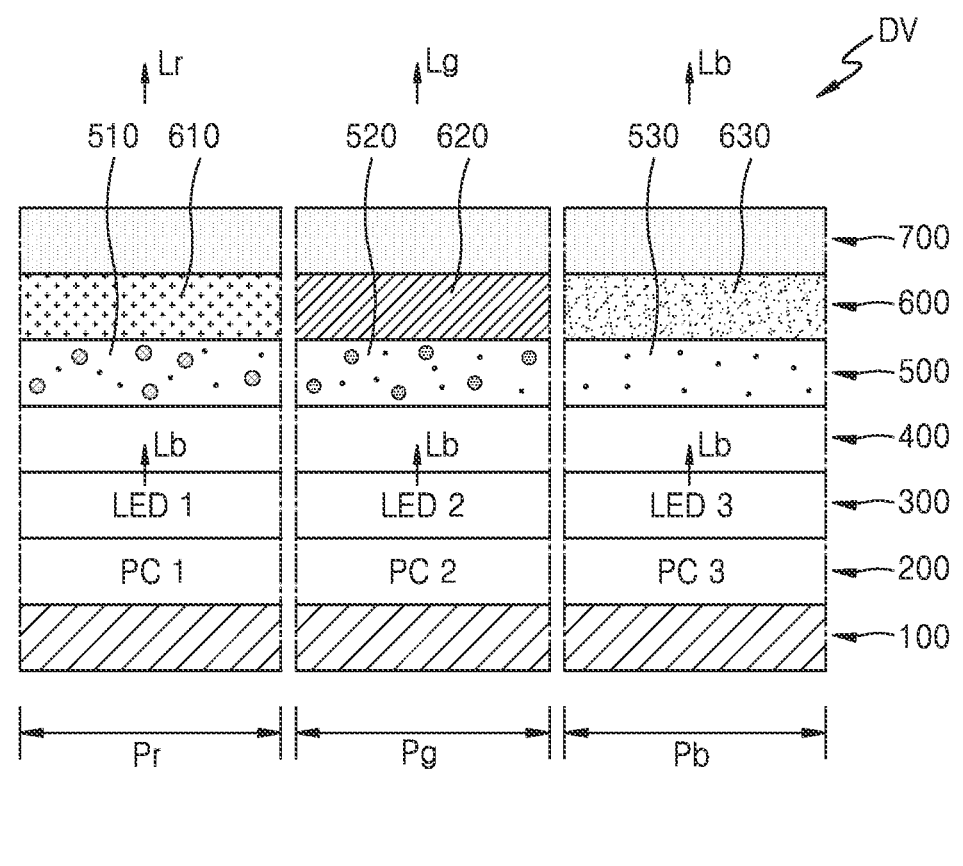
FIG. 2 is a schematic cross-sectional view of sub-pixels of a display apparatus according to some embodiments.

FIG. 2 is a schematic cross-sectional view of sub-pixels of the display apparatus DV according to some embodiments.

Referring to FIG. 2, the display apparatus DV may include a circuit layer 200 on a substrate 100. The circuit layer 200 may include first to third sub-pixel circuits PC1, PC2, and PC3. The first to third sub-pixel circuits PC1, PC2, and PC3 may be respectively electrically connected to first to third light-emitting diodes LED1, LED2, and LED3 of a light-emitting diode layer 300.

The first to third light-emitting diodes LED1, LED2, and LED3 may each include an organic light-emitting diode including an organic material. According to some embodiments, the first to third light-emitting diodes LED1, LED2, and LED3 may each include an inorganic light-emitting diode including an inorganic material. The inorganic light-emitting diode may include a PN-junction diode including inorganic material semiconductor-based materials. When a forward voltage is applied to a PN-junction diode, holes and electrons are injected and energy created by recombination of the holes and the electrons is converted to light energy, and thus, light of a preset color may be emitted. The inorganic light-emitting diode may have a width of several micrometers to hundreds of micrometers, or several nanometers to hundreds of nanometers. In some embodiments, the first to third light-emitting diodes LED1, LED2, and LED3 may be light-emitting diodes including quantum dots. As described above, an emission layer of the first to third light-emitting diodes LED1, LED2, and LED3, may include an organic material, an inorganic material, quantum dots, an organic material and quantum dots, or an inorganic material and quantum dots.

The first to third light-emitting diodes LED1, LED2, and LED3 may emit light of the same color. As an example, the first to third light-emitting diodes LED1, LED2, and LED3 may each be configured to emit light in a first wavelength band (e.g., blue light Lb). The first wavelength band may be in a range from about 450 nm to about 495 nm. Light (e.g., blue light Lb) emitted from the first to third light-emitting diodes LED1, LED2, and LED3, may pass through a color conversion-transmissive layer 500 through an encapsulation layer 400 on the light-emitting diode layer 300.

The color conversion-transmissive layer 500 may include optical portions configured to convert the color of light (e.g., blue light Lb) emitted from the light-emitting diode layer 300, or configured to transmit the light without converting the color. As an example, the color conversion-transmissive layer 500 may include color converters and a transmitter, wherein the color converters convert light (e.g., blue light Lb) emitted from the light-emitting diode layer 300 to light of a different color, and the transmitter transmits light (e.g., blue light Lb) emitted from the light-emitting diode layer 300 without converting a color thereof. The color conversion-transmissive layer 500 may include a first color converter 510 corresponding to the red sub-pixel Pr, a second color converter 520 corresponding to the green sub-pixel Pg, and a transmitter 530 corresponding to the blue sub-pixel Pb. The first color converter 510 may be configured to convert light (e.g., blue light Lb) in the first wavelength band into light (e.g., red light Lr) in a second wavelength band. The second wavelength band may be in a range from about 630 nm to about 780 nm. The second color converter 520 may be configured to convert light (e.g., blue light Lb) in the first wavelength band into light (e.g., green light Lg) in a third wavelength band. The third wavelength band may be in a range from about 495 nm to about 570 nm. The transmitter 530 may be configured to transmit light (e.g., blue light Lb) in the first wavelength band without converting the light. However, the embodiments are not limited thereto, but a wavelength band of light (e.g., blue light Lb) which emitted from the light-emitting diode layer 300 and which the color conversion-transmissive layer 500 converts, may be different from a wavelength band after the conversion.

A color layer 600 may be located on the color conversion-transmissive layer 500. The color layer 600 may include first to third color filters 610, 620, and 630 of different colors. As an example, the first color filter 610 may be a red color filter configured to transmit only light in a wavelength band ranging from 630 nm to about 780 nm. The second color filter 620 may be a green color filter configured to transmit only light in a wavelength band ranging from 495 nm to about 570 nm. The third color filter 630 may be a blue color filter configured to transmit only light in a wavelength band ranging from 450 nm to about 495 nm.

According to some embodiments, a black matrix may be located between the first to third color filters 610, 620, and 630. According to some embodiments, the first color filter 610 may have an opening corresponding to the green sub-pixel Pg and the blue sub-pixel Pb, the second color filter 620 may have an opening corresponding to the red sub-pixel Pr and the blue sub-pixel Pb, and the third color filter 630 may have an opening corresponding to the red sub-pixel Pr and the blue sub-pixel Pb. A portion in which the first to third color filters 610, 620, and 630 overlap each other among a region except the openings respectively corresponding to the red sub-pixel Pr, the green sub-pixel Pg, and the blue sub-pixel Pb, may serve as the black matrix.

Light that is color-converted or transmitted by the color conversion-transmissive layer 500 may be improved in color purity thereof while respectively passing through the first to third color filters 610, 620, and 630. In addition, the color layer 600 may prevent or reduce external light (e.g., light incident to the display apparatus DV from the outside of the display apparatus DV) from being reflected and viewed by a user.

A light-transmissive base layer 700 may be located on the color layer 600. The light-transmissive base layer 700 may include glass or a light-transmissive organic material. As an example, the light-transmissive base layer 700 may include a light-transmissive organic material such as an acryl-based resin.

According to some embodiments, the light-transmissive base layer 700 is a kind of substrate. The color layer 600 and color conversion-transmissive layer 500 are formed on the light-transmissive base layer 700, and then the color conversion-transmissive layer 500 may be integrated to face the encapsulation layer 400.

According to some embodiments, after the color conversion-transmissive layer 500 and the color layer 600 are sequentially formed on the encapsulation layer 400, the light-transmissive base layer 700 may be directly coated and cured on the color layer 600. According to some embodiments, another optical film, for example, an anti-reflection (AR) film and the like may be located on the light-transmissive base layer 700.

The display apparatus DV having the above structure may include electronic apparatuses that may display moving images or still images such as televisions, advertisement boards, screens for a theater, monitors, tablet personal computers, and the like.

Figure 3:
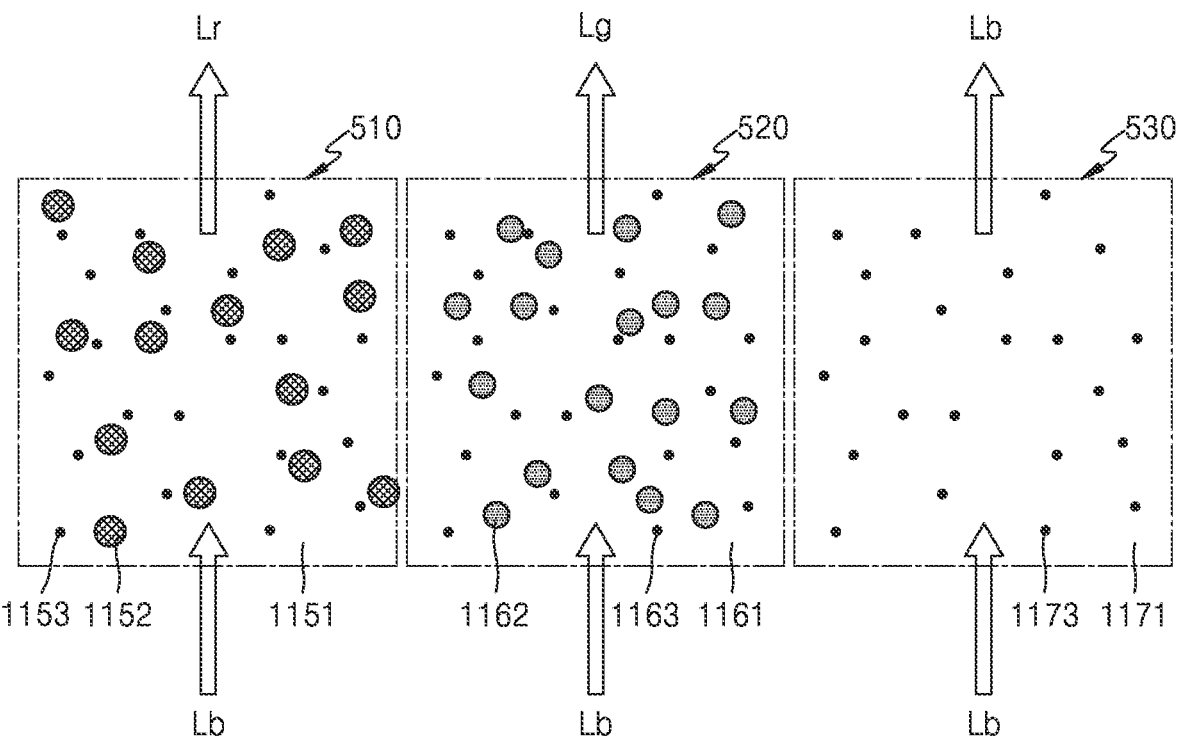
FIG. 3 is a view of respective optical portions of a color conversion-transmissive layer of FIG. 2 according to some embodiments.

FIG. 3 is a view of respective optical portions of the color conversion-transmissive layer 500 of FIG. 2.

The first color converter 510 may convert blue light Lb incident thereto to red light Lr. As shown in FIG. 3, the first color converter 510 may include a first photosensitive polymer 1151, first quantum dots 1152 dispersed in the first photosensitive polymer 1151, and first scattering particles 1153.

The first quantum dots 1152 may be excited by blue light Lb and configured to isotropically emit red light Lr having a greater wavelength than the wavelength of the blue light Lb. The first photosensitive polymer 1151 may be an organic material having light transmittance.

A quantum dot denotes a crystal of a semiconductor compound and may include an arbitrary material that may emit light in various light emission wavelengths depending on the size of the crystal. A diameter of the quantum dots may be, for example, about 1 nm to about 10 nm.

Quantum dots may be synthesized by a wet chemical process, a metal organic chemical vapor deposition process, a molecular beam epitaxy process, or a similar process. A wet chemical process is a method of mixing an organic solvent with a precursor material and then growing quantum dot crystals. In a wet chemical process, when the crystal grows, the organic solvent naturally acts as a dispersant coordinated on the surface of the quantum dot crystal and controls the growth of the crystal. Accordingly, the wet chemical process is easier than vapor deposition such as metal organic chemical vapor deposition (MOCVD) or molecular beam epitaxy (MBE). In addition, the wet chemical process may be configured to control the growth of the quantum dots at low costs.

The quantum dot may include one of a Group III-VI semiconductor compound, a Group II-VI semiconductor compound, a Group III-V semiconductor compound, a Group I-III-VI semiconductor compound, a Group IV-VI semiconductor compound, a Group IV element or compound, or an arbitrary combination thereof.

Examples of a Group III-VI semiconductor compound may include a two-element compound including GaS, GaSe, $Ga_2Se_3$, GaTe, InS, InSe, $In_2Se_3$ and InTe, and a three-element compound including $InGaS_3$ and $InGaSe_3$, and an arbitrary combination thereof.

Examples of a Group II-VI semiconductor compound may include a two-element compound including CdS, CdSe, CdTe, ZnS, ZnSe, ZnTe, ZnO, HgS, HgSe, HgTe, MgSe or MgS, but CdSeS, CdSeTe, CdSTe, ZnSeS, ZnSeTe, ZnSTe, ZnSTe, a three-element compound including HgSeS, HgSeTe, HgSTe, CdZnS, CdZnSe, CdZnTe, CdHgS, CdHgSe, CdHgTe, HgZnS, HgZnSe, HgZnTe, MgZnSe or MgZnS, CdZnSeS, CdZnSe, CdZnSeS, Cd CSeTSe, a four-element compound including HgZnSTe and the like, and an arbitrary combination thereof.

Examples of a group III-V semiconductor compound may include a two-element compound including one of GaN, GaP, GaAs, GaSb, AlN, AlP, AlAs, AlSb, InN, InP, InAs, and InSb; a three-element compound including one of GaNP, GaNAs, GaNSb, GaPAs, GaPSb, AlNP, AlNAs, AlNSb, AlPAs, AlPSb, InGaP, InNP, InAlP, InNAs, InNSb, InPAs and InPSb; and a four-element compound including one of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb, and an arbitrary combination thereof. The III-V semiconductor compound may further include a Group II element. Examples of a Group III-V semiconductor compound further including a Group II element may include InZnP, InGaZnP, or InAlZnP.

Examples of a Group I-III-VI semiconductor compound may include a three-element compound including AgInS, $AgInS_2$, CuInS, $CuInS_2$, $CuGaO_2$, $AgGaO_2$, or $AgAlO_2$, and an arbitrary combination thereof.

Examples of a Group IV-VI semiconductor compound may include a two-element compound including SnS, SnSe, SnTe, PbS, PbSe, or PbTe, a three-element compound including SnSeS, SnSeTe, SnSTe, PbSeS, PbSeTe, PbSTe, SnPbS, SnPbSe, or SnPbTe, a four-element compound including SnPbSSe, SnPbSeTe, or SnPbSTe, or an arbitrary combination thereof.

A Group IV element or compound may include a single-element compound including Si or Ge, or a two-element compound including SiC or SiGe, or an arbitrary combination thereof.

Each element included in a multi-element compound such as a two-element compound, a three-element compound, and a four-element compound may be present in a particle in a uniform concentration or a non-uniform concentration.

A quantum dot may have a single structure in which the concentration of each element included in the relevant quantum dot is uniform, or a double structure of a core-shell. As an example, a material of the core may be different from a material of the shell. The shell of a quantum dot may serve as a protective layer that prevents a chemical change of the core to maintain a semiconductor characteristic and/or serve as a charging layer for giving an electrophoretic characteristic to the quantum dot. The shell may include a single layer or a multi-layer. An interface between the core and the shell may have a concentration gradient in which the concentration of an element existing in the shell reduces toward the center.

Examples of the shell of the quantum dot include oxide of metal or non-metal, a semiconductor compound, or a combination thereof. Examples of oxides of metals or non-metals may include a two-element compound including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and a three-element compound including $MgAl_2O_4$, $CoFe_2O_4$, $NiFe_2O_4$, $CoMn_2O_4$, and an arbitrary combination thereof. Examples of the semiconductor compound may include, as described above, a Group III-VI semiconductor compound, a Group II-VI semiconductor compound, a Group III-V semiconductor compound, a Group I-III-VI semiconductor compound, and a Group IV-VI semiconductor compound, or an arbitrary combination thereof. As an example, the semiconductor compound may include one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and an arbitrary combination thereof.

A quantum dot may have a full width of half maximum (FWHM) of a light emission wavelength spectrum of 45 nm or less, specifically about 40 nm or less, and more specifically about 30 nm or less. Within this range, color purity or color reproduction may be improved. In addition, because light emitted from the quantum dot is emitted in all directions, a viewing angle of light may be improved.

In addition, the shape of the quantum dot may be a spherical shape, a pyramid shape, a multi-arm shape, a cubic shape, a nanoparticle, a nanotube, a nanowire, a nanofiber, a nano plate particle, or the like.

Because an energy band gap may be adjusted by adjusting the size of the quantum dot, light in various wavelength bands may be obtained from a quantum-dot emission layer. Accordingly, a light-emitting element that emits light in various wavelengths may be implemented by using quantum dots of different sizes. For example, the size of the quantum dot may be selected such that red, green, and/or blue light is emitted. In addition, the size of the quantum dot may be configured such that light in various colors is combined to emit white light.

The first scattering particles 1153 may increase a color-converting efficiency by scattering blue light Lb not absorbed in the first quantum dots 1152 and allowing more first quantum dots 1152 to be excited. The first scattering particles 1153 may be, for example, metal oxide particles or organic particles. Examples of metal oxides for scattering particles include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and organic materials for scatterers. Examples of an organic material for the scattering particles include an acrylic resin or a urethane resin. The scattering particles may scatter light in various directions regardless of an incident angle while substantially not converting the wavelength of incident light. Through this, the scattering particles may improve the lateral visibility of the display apparatus DV.

The second color converter 520 may convert blue light Lb incident thereto to green light Lg. As shown in FIG. 3, the second color converter 520 may include a second photosensitive polymer 1161, second quantum dots 1162 dispersed in the second photosensitive polymer 1161, and second scattering particles 1163.

The second quantum dots 1162 may be excited by blue light Lb and configured to isotropically emit green light Lg having a greater wavelength than the wavelength of the blue light Lb. The second photosensitive polymer 1161 may be an organic material having light transmittance.

The second scattering particles 1163 may increase a color-converting efficiency by scattering blue light Lb not absorbed in the second quantum dots 1162 and allowing more second quantum dots 1162 to be excited. Because the descriptions for the first quantum dots 1152 and the first scattering particles 1153 described above are applicable to the second quantum dots 1162 and the second scattering particles 1163, descriptions for the second quantum dots 1162 and the second scattering particles 1163 are omitted.

According to some embodiments, the first quantum dots 1152 may include the same material as the material of the second quantum dots 1162. In this case, the size of the first quantum dots 1152 may be greater than the size of the second quantum dots 1162.

The transmitter 530 may transmit blue light Lb without converting the blue light Lb incident to the transmitter 530. Accordingly, the transmitter 530 does not have quantum dots. As shown in FIG. 3, the transmitter 530 may include third scattering particles 1173 and a third photosensitive polymer 1171 in which third scattering particles 1173 are dispersed. The third photosensitive polymer 1171 may include, for example, an organic material having a light transmittance such as a silicon resin, epoxy resin, and the like, and include the same material as the material of the first photosensitive polymer 1151 and the second photosensitive polymer 1161. The third scattering particles 1173 may be configured to scatter and emit blue light Lb and include the same material as those of the first and second scattering particles 1153 and 1163.

Figure 4:
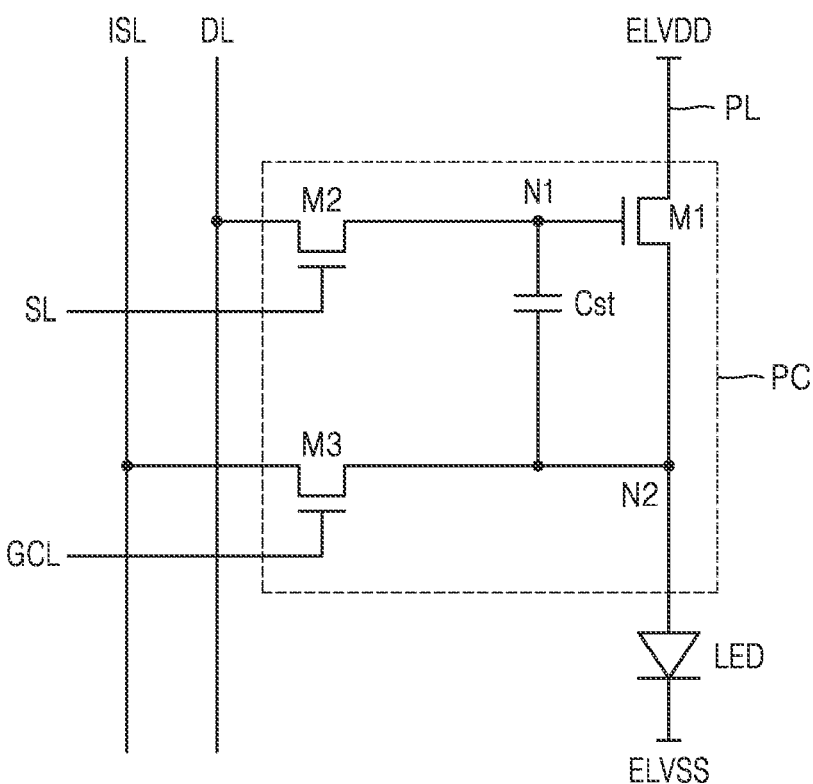
FIG. 4 is a schematic equivalent circuit diagram of a light-emitting diode and a sub-pixel circuit electrically connected to the light-emitting diode, of a display apparatus according to some embodiments.

FIG. 4 is a schematic equivalent circuit diagram of a light-emitting diode and a sub-pixel circuit electrically connected to the light-emitting diode of the display apparatus according to some embodiments. The sub-pixel circuit PC shown in FIG. 4 may correspond to each of the first to third sub-pixel circuits PC1, PC2, and PC3 described above with reference to FIG. 2, and the light-emitting diode LED of FIG. 4 may correspond to each of the first to third light-emitting diodes LED1, LED2, and LED3 described above with reference to FIG. 2.

Referring to FIG. 4, a first electrode (e.g., a pixel electrode) of the light-emitting diode LED may be connected to the sub-pixel circuit PC, and a second electrode (e.g., an opposite electrode) of the light-emitting diode LED may be connected to a common voltage line described below with reference to FIG. 5 and configured to receive a common voltage ELVSS. The light-emitting diode LED may be configured to emit light at a brightness corresponding to the amount of current supplied from the sub-pixel circuit PC.

The sub-pixel circuit PC may be configured to control the amount of a current flowing through the light-emitting diode LED according to a data signal. The sub-pixel circuit PC may include a first transistor M1, a second transistor M2, a third transistor M3, and a storage capacitor Cst.

Each of the first transistor M1, the second transistor M2, and the third transistor M3 may be an oxide semiconductor transistor including a semiconductor layer that includes an oxide semiconductor, or may be a silicon semiconductor transistor including a semiconductor that includes polycrystalline silicon. A first electrode of a transistor may be one of a source electrode and a drain electrode, and a second electrode of the transistor may be the other of the source electrode and the drain electrode depending on the type of the transistor.

The first transistor M1 may be a driving transistor. The first electrode of the first transistor M1 may be connected to a driving voltage line PL configured to supply a driving voltage ELVDD, and the second electrode of the first transistor M1 may be connected to the first electrode of the light-emitting diode LED. A gate electrode of the first transistor M1 may be connected to a first node N1. The first transistor M1 may be configured to control the amount of current flowing from the driving voltage ELVDD to the light-emitting diode LED according to a voltage of the first node N1.

The second transistor M2 may be a switching transistor. A first electrode of the second transistor M2 may be connected to a data line DL, and a second electrode of the second transistor M2 may be connected to the first node N1. A gate electrode of the second transistor M2 may be connected to a scan line SL. When a scan signal is supplied through the scan line SL, the second transistor M2 may be turned on to electrically connect the data line DL to the first node N1.

The third transistor M3 may be an initialization transistor and/or a sensing transistor. A first electrode of the third transistor M3 may be connected to a second node N2, and a second electrode of the third transistor M3 may be connected to a sensing line ISL. A gate electrode of the third transistor M3 may be connected to a control line GCL.

The storage capacitor Cst may be connected between the first node N1 and the second node N2. As an example, a first capacitor electrode of the storage capacitor Cst may be connected to the gate electrode of the first transistor M1, and a second capacitor electrode of the storage capacitor Cst may be connected to the first electrode of the light-emitting diode LED.

Though it is shown in FIG. 4 that the first transistor M1, the second transistor M2, and the third transistor M3 are n-channel metal oxide semiconductor (MOS) field-effect transistors (FETs), the embodiments are not limited thereto. As an example, at least one of the first transistor M1, the second transistor M2, or the third transistor M3 may be a p-channel metal oxide semiconductor (MOS) field-effect transistors (FETs).

Though FIG. 4 shows three transistors, the embodiments are not limited thereto. The sub-pixel circuit PC may include four or more transistors.

Figure 5:
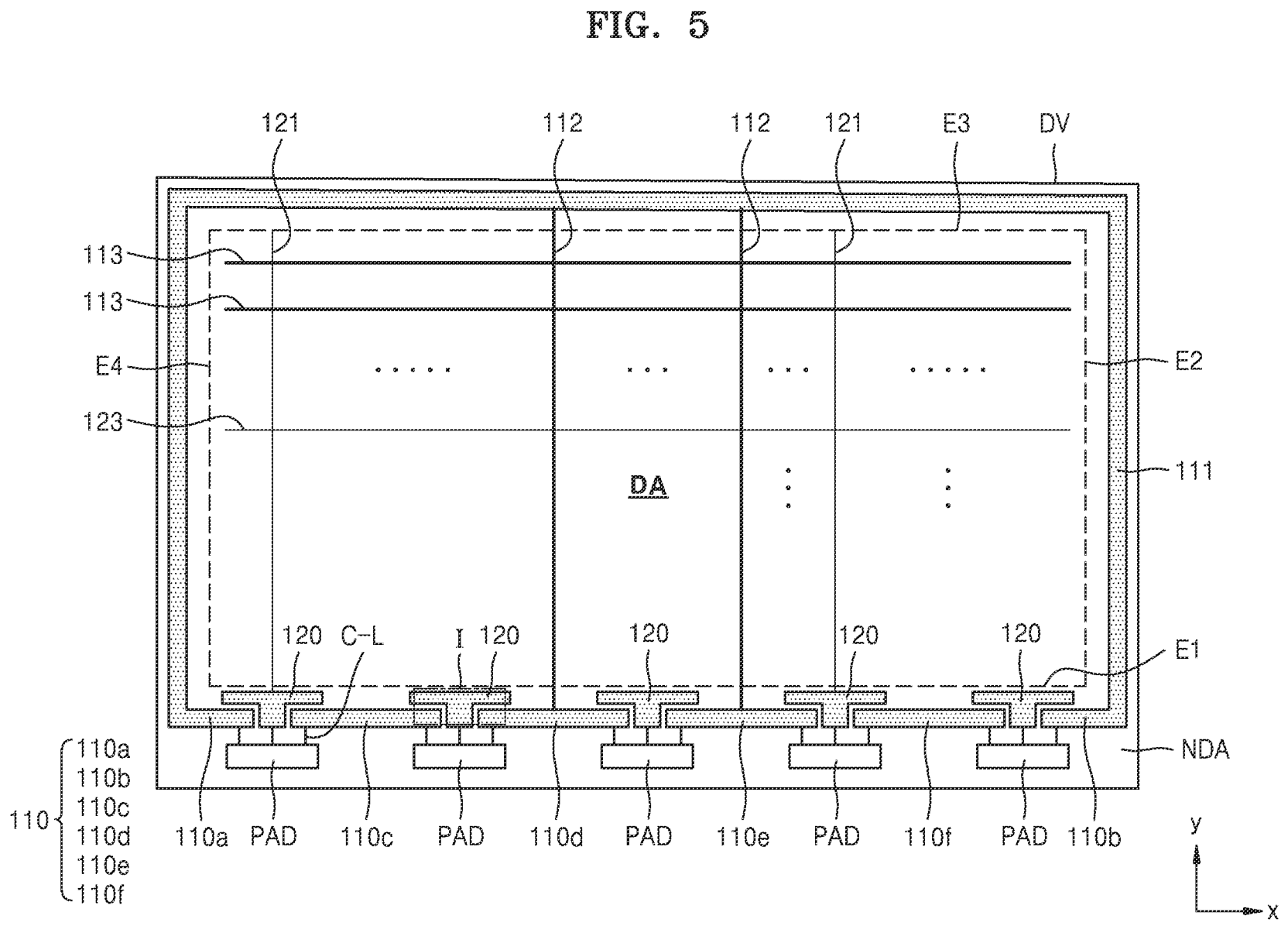

FIG. 5 is a schematic plan view of the display apparatus according to some embodiments.

As described above with reference to FIG. 1, the display apparatus DV may include the display area DA and the non-display area NDA outside (e.g., in a periphery our outside a footprint of) the display area DA, wherein the plurality of sub-pixels are arranged in the display area DA. The non-display area NDA is a region in which images are not displayed. A driver or a voltage wiring configured to electrical signals or power to the sub-pixel circuits PC (see FIG. 4), may be arranged in the non-display area NDA. The non-display area NDA may include a pad PAD, the pad PAD being a region to which electronic elements or a printed circuit board may be electrically connected.

Referring to FIG. 5, a common voltage input unit 110, a driving voltage input unit 120, and the pad PAD may be located in the non-display area NDA adjacent to a first edge E1 of the display area DA.

The common voltage input unit 110 may be provided in plurality along the first edge E1 of the display area DA. With regard to this, it is shown in FIG. 5 that a first common voltage input unit 110a and a second common voltage input unit 110b are respectively arranged on two opposite ends of the first edge E1 of the display area DA, and third to sixth common voltage input units 110c, 110d, 110e, and 110f are arranged to be apart from each other along the first edge E1.

The first common voltage input unit 110a may be connected to the second common voltage input unit 110b by a main common voltage line 111 extending along a second edge E2, a third edge E3, and a fourth edge E4 of the display area DA. In other words, the first common voltage input unit 110a, the second common voltage input unit 110b, and the main common voltage line 111 may be integrally formed.

The common voltage input units 110 and the main common voltage line 111 may be electrically connected to the second electrodes of the light-emitting diodes LED (see FIG. 4). As an example, the second electrode of the light-emitting diodes LED (see FIG. 4) may cover the display area DA entirely, extend to the non-display area NDA, and directly contact the common voltage input units 110 and a portion of the main common voltage line 111.

Vertical common voltage lines 112 and horizontal common voltage lines 113 may be arranged in the display area DA, wherein the vertical common voltage lines 112 and the horizontal common voltage lines 113 are electrically connected to the common voltage input unit 110 and the main common voltage line 111. The vertical common voltage lines 112 crosses the display area DA in a second direction (e.g., a y direction) to electrically connect the common voltage input unit 110 to the main common voltage line 111. The horizontal common voltage lines 113 may extend in a first direction (e.g., an x direction) from the display area DA and be electrically connected to the vertical common voltage lines 112.

In the case where the area of the display area DA is large, a voltage drop may be caused to the second electrode of the light-emitting diode LED (see FIG. 4) for each portion in the display area DA. For example, because the central portion of the display area DA is located away from the common voltage input unit 110 and the main common voltage line 111, a voltage drop is caused by a resistance of the second electrode itself, and thus, a display quality may be reduced. Because the vertical common voltage line 112 and the horizontal common voltage line 113 crossing the display area DA are connected to the second electrode of the light-emitting diode LED (see FIG. 4) in the display area DA, the above-described issue of the voltage drop may be prevented.

The driving voltage input unit 120 may be provided in plurality along the first edge E1 of the display area DA. As shown in FIG. 5, each of the driving voltage input units 120 may be arranged between the common voltage input units 110 arranged apart from each other. The pads PAD may be arranged to correspond to the driving voltage input units 120. As an example, the driving voltage input unit 120, and the common voltage input units 110 may be connected to the pad PAD through a connection line C-L, wherein the common voltage input units 110 are arranged on two opposite sides with the driving voltage input unit 120 therebetween.

The driving voltage input unit 120 may be electrically connected to a vertical driving voltage line 121 and a horizontal driving voltage line 123, wherein the vertical driving voltage line 121 crosses the display area DA I in the second direction (e.g., the y direction), and the horizontal driving voltage line 123 crosses the display area DA in the first direction (e.g., the x direction). The vertical driving voltage line 121 may be the driving voltage line PL described with reference to FIG. 4.

In the case where the area of the display area DA is large, a voltage drop may be caused to the vertical driving voltage line 121 for each portion in the display area DA. As an example, because a portion adjacent to the third edge E3 of the display area DA is located away from the driving voltage input unit 120, a voltage drop may be caused by a resistance of the vertical driving voltage line 121 itself. Accordingly, because the horizontal driving voltage lines 123 crossing the display area DA in the first direction (e.g., the x direction) are connected to the vertical driving voltage lines 121, the above-described issue of the voltage drop may be prevented.

Figure 6:
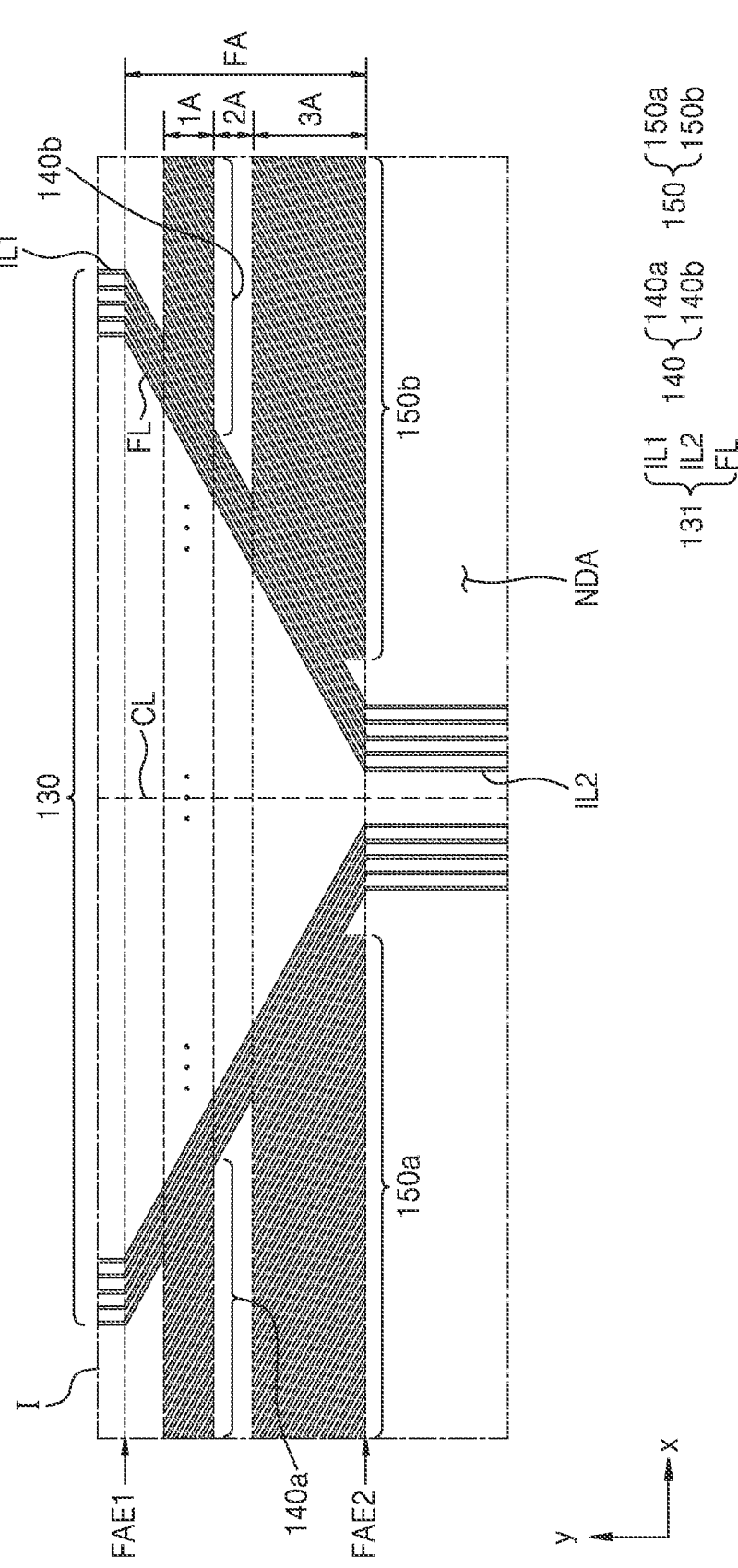
FIG. 6 is an enlarged plan view of a region I of FIG. 5 according to some embodiments.
Figure 7:
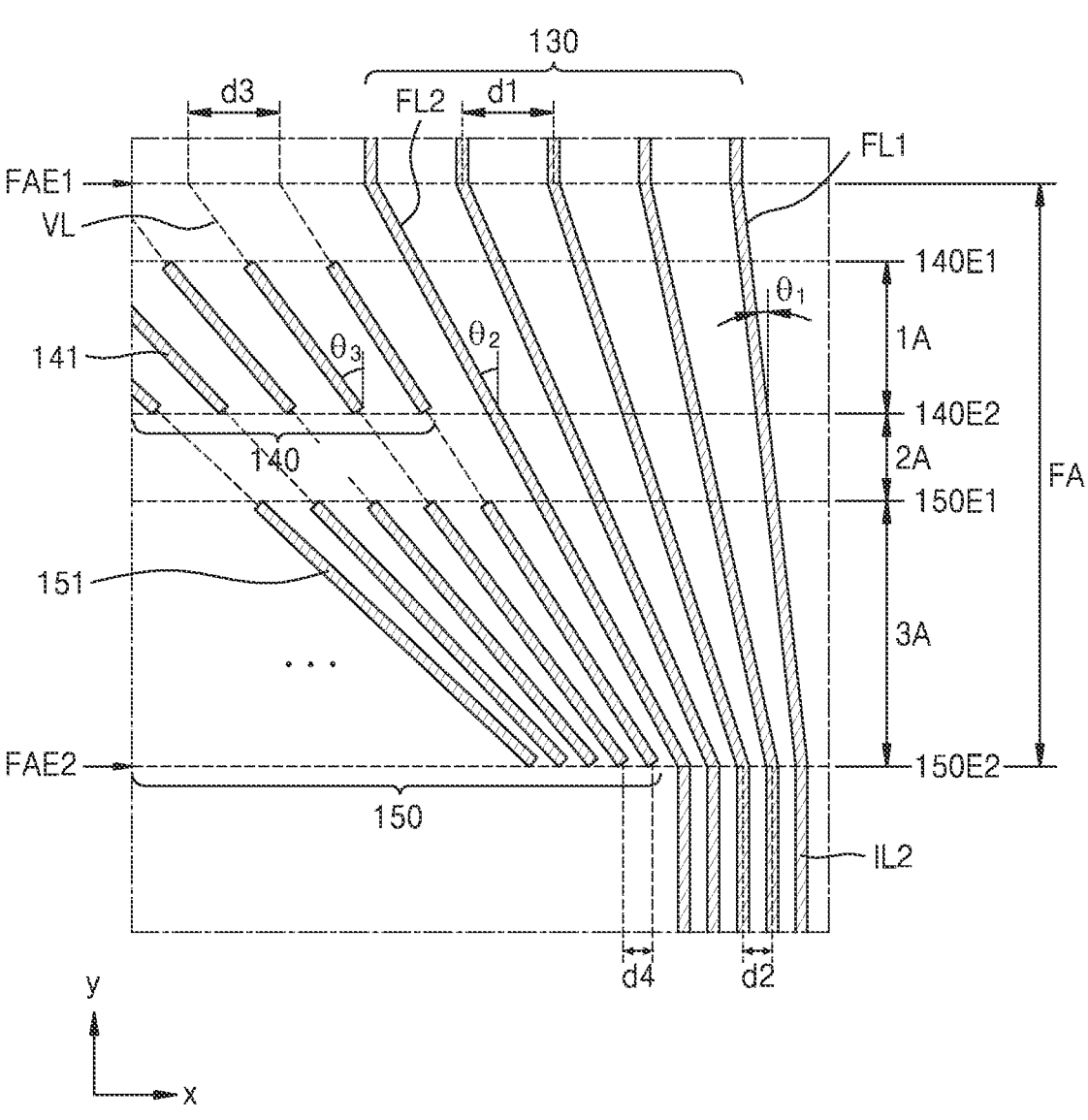
FIGS. 7 and 8 are schematic plan views of the arrangements of a signal wiring portion, a first dummy wiring portion, and a second dummy wiring portion, according to some embodiments.
Figure 8:
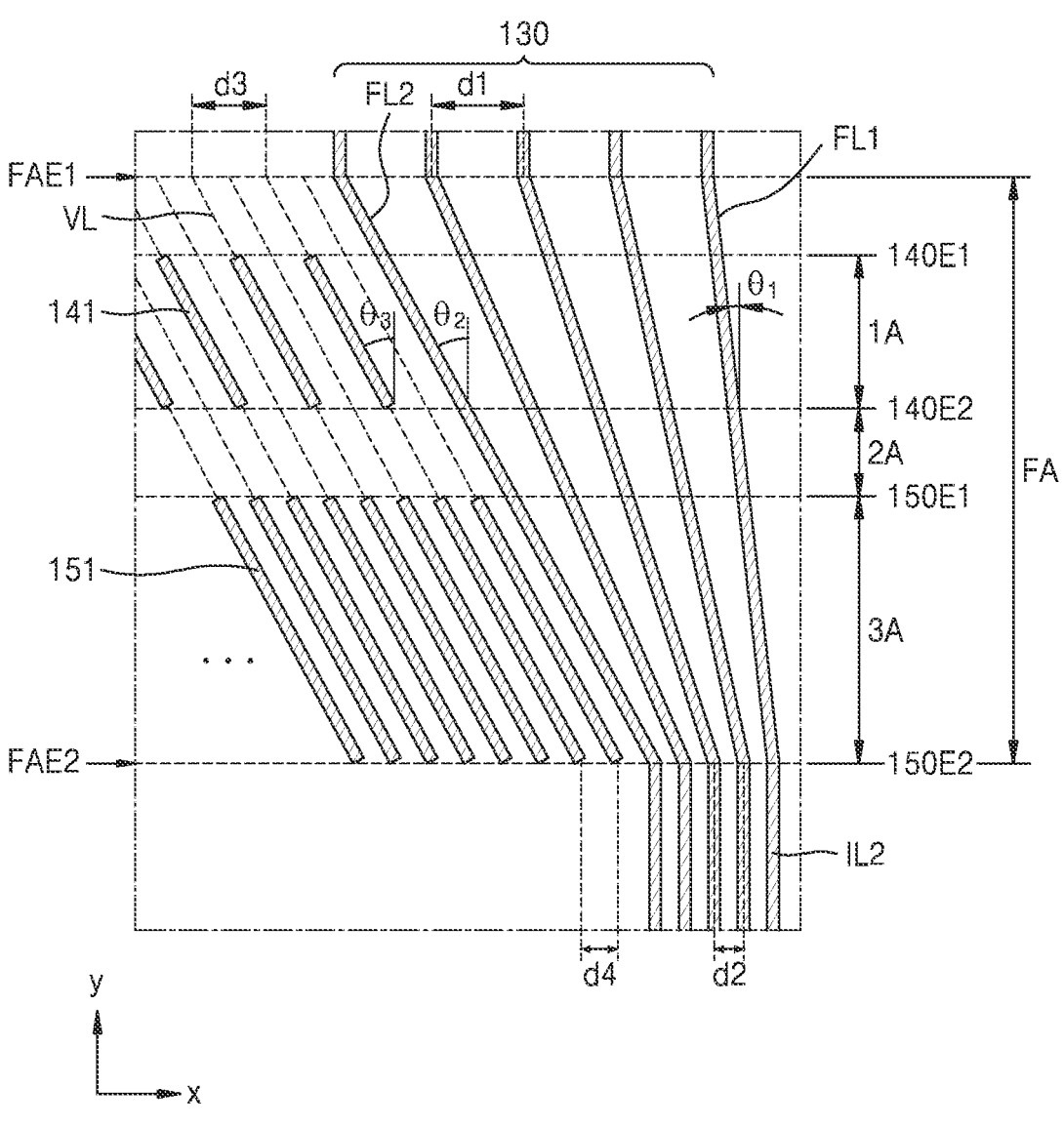

FIG. 6 is an enlarged plan view of a region I of FIG. 5, and FIGS. 7 and 8 are schematic plan views of the arrangements of a signal wiring portion, a first dummy wiring portion, and a second dummy wiring portion according to some embodiments. FIGS. 6, 7, and 8 schematically show only the signal wiring portion 130, the first dummy wiring portion 140, and the second dummy wiring portion 150, and omit other elements. FIGS. 7 and 8 schematically show the signal wiring portion 130, the first dummy wiring portion 140, and the second dummy wiring portion 150 arranged on one side of a virtual center line CL passing through the center of fan-out wirings FL, and the number of wirings constituting the signal wiring portion 130, the first dummy wiring portion 140, and the second dummy wiring portion 150 are provided as an example, and the scope of the disclosure is not limited thereto.

Referring to FIG. 6, the signal wiring portion 130 is located in the non-display area NDA. The signal wiring portion 130 may include a plurality of signal wirings 131 extending from the pad PAD (see FIG. 5) to be adjacent to the display area DA (see FIG. 5). The signal wirings 131 may be wirings configured to transfer electrical signals to sub-pixels located inside the display area DA (see FIG. 5). Each of the signal wirings 131 may include a first input line IL1, a second input line IL2, and the fan-out wiring FL, wherein the first input line IL1 is adjacent to the display area DA (see FIG. 5), the second input line IL2 is adjacent to the pad PAD (see FIG. 5), and the fan-out wiring FL electrically connects the first input line IL1 to the second input line IL2. According to some embodiments, the first input line IL1, the second input line IL2, and the fan-out wiring FL may be integrally provided. According to some embodiments, one or more of the first input line IL1, the second input line IL2, and the fan-out wiring FL may be located on different layers and electrically connected to each other.

The second input lines IL2 may be adjacent to each other to be electrically connected to the pad PAD (see FIG. 5). The first input lines IL1 may be relatively more apart from each other than the second input lines IL2. This is because of the locations of elements receiving electrical signals transferred from each of the signal wirings 131. Accordingly, as shown in FIGS. 7 and 8, an interval between the fan-out wirings FL is different depending on the position thereof in a fan-out area FA in which the fan-out wirings FL are arranged. As an example, a first distance d1 between the fan-out wirings FL in a first edge FAE1 of the fan-out area FA, may be greater than a second distance d2 between the fan-out wirings FL in a second edge FAE2 of the fan-out area FA.

This is because the fan-out wirings FL extend in an oblique direction with respect to the second direction (e.g., the y direction). A first angle $\theta_1$ formed by a first fan-out wiring FL1 and the second direction (e.g., the y direction), may be less than a second angle $\theta_2$ formed by a second fan-out wiring FL2 and the second direction, wherein the first fan-out wiring FL1 is close to the virtual center line CL passing through the center of the fan-out wirings FL, and the second fan-out wiring FL2 is located in the outermost portion among the fan-out wirings FL.

Because angles formed by the fan-out wirings FL adjacent to each other and the second direction (e.g., the y direction), may be approximately equal or similar to each other, the fan-out wirings FL adjacent to each other may be approximately parallel to each other without overlapping each other.

The fan-out area FA may include a first area 1A, a second area 2A, and a third area 3A each extending in the first direction (e.g., the x direction). The first area 1A may be arranged close to the display area DA (see, e.g., FIG. 5), the third area 3A may be arranged close to the pad PAD (see, e.g., FIG. 5), and the second area 2A may be arranged between the first area 1A and the third area 3A.

As shown in FIGS. 7 and 8, the first area 1A may be defined as a region between a first edge 140E1 and a second edge 140E2 of the first dummy wiring portion 140. The first dummy wiring portion 140 may include a plurality of first dummy wirings 141. Two opposite ends of the plurality of first dummy wirings 141 may be respectively located in the first edge 140E1 and the second edge 140E2. The third area 3A may be defined as a region between a first edge 150E1 and a second edge 150E2 of the second dummy wiring portion 150. The second dummy wiring portion 150 may include a plurality of second dummy wirings 151. Two opposite ends of the plurality of second dummy wirings 151 may be respectively located in the first edge 150E1 and the second edge 150E2. The second area 2A may be defined as a region between the second edge 140E2 of the first dummy wiring portion 140 and the first edge 150E1 of the second dummy wiring portion 150.

The first dummy wiring portion 140 and the second dummy wiring portion 150 are arranged outside the fan-out wirings FL. It is shown in FIGS. 7 and 8 that the first dummy wiring portion 140 and the second dummy wiring portion 150 are arranged outside the second fan-out wiring FL2 located in the outermost portion among the fan-out wirings FL. The first dummy wiring portion 140 may include a (1-1)st dummy wiring portion 140a and a (1-2)nd dummy wiring portion 140b which are symmetric to each other with respect to the virtual center line CL passing through the center of the fan-out wirings FL. Likewise, the second dummy wiring portion 150 may include a (2-1)st dummy wiring portion 150a and a (2-2)nd dummy wiring portion 150b which are symmetric to each other with respect to the virtual center line CL passing through the center of the fan-out wirings FL.

The first dummy wiring portion 140 may include a plurality of first dummy wirings 141 arranged according to a rule equal or similar to a rule of the arrangement of the fan-out wirings FL in the first area 1A. The second dummy wiring portion 150 may include a plurality of second dummy wirings 151 arranged according to a rule equal or similar to a rule of the arrangement of the fan-out wirings FL in the third area 3A.

The fan-out wirings FL extend to the first area 1A and the third area 3A across the second area 2A, but the first dummy wirings 141 and the second dummy wirings 151 do not extend to the second area 2A. In other words, the first dummy wiring portion 140 may be apart from the second dummy wiring portion 150 with the second area 2A therebetween. According to some embodiments, as shown in FIG. 7, the first dummy wirings 141 of the first dummy wiring portion 140 may be arranged according to a rule same as a rule of the arrangement of the fan-out wirings FL.

According to some embodiments, as shown in FIG. 7, the first dummy wirings 141 of the first dummy wiring portion 140 may be arranged according to the same rule as a rule of the arrangement of the fan-out wirings FL. As an example, the fan-out wirings FL may be apart by the first distance d1 from each other in the first edge FAE1 of the fan-out area FA, and apart by the second distance d2 from each other in the second edge FAE2 of the fan-out area FA. Virtual extension lines VL extending along the center of the first dummy wirings 141 in the first edge FAE1 of the fan-out area FA, may be apart by a third distance d3 from each other. In this case, the first distance d1 may be approximately equal to the third distance d3. Virtual extension lines VL extending along the center of the first dummy wirings 141 in the second edge FAE2 of the fan-out area FA, may be apart by a fourth distance d4 from each other. In this case, the second distance d2 may be approximately equal to the fourth distance d4.

As an example, a third angle $\theta_3$ formed by one of the first dummy wirings 141 and the second direction (e.g., they direction), may be greater than the second angle $\theta_2$ formed by the second fan-out wiring FL2 located in the outermost portion among the fan-out wirings FL and the second direction (e.g., the y direction). The third angle $\theta_3$ formed by one of the first dummy wirings 141 and the second direction (e.g., the y direction), may increase as the first dummy wiring 141 is away from the fan-out wirings FL.

Likewise, the second dummy wirings 151 of the second dummy wiring portion 150 may be arranged according to the same rule as a rule of the arrangement of the fan-out wirings FL. As an example, virtual extension lines VL extending along the center of each of the second dummy wirings 151 in the first edge FAE1 of the fan-out area FA, may be apart by the third distance d3 from each other. In this case, the first distance d1 may be approximately equal to the third distance d3. Virtual extension lines VL extending along the center of each of the second dummy wirings 151 in the second edge FAE2 of the fan-out area FA, may be apart by a fourth distance d4 from each other. In this case, the second distance d2 may be approximately equal to the fourth distance d4. The virtual extension lines VL extending along the center of each of the second dummy wirings 151, may respectively coincide with the virtual extension lines VL extending along the center of each of the first dummy wirings 141. That is, the first dummy wiring 141 and the second dummy wiring 151 may be arranged on the same virtual straight line.

According to some embodiments, as shown in FIG. 8, the first dummy wirings 141 of the first dummy wiring portion 140 and the second dummy wirings 151 of the second wiring portion 150, may each be arranged in parallel to the second fan-out wiring FL2 located in the outermost portion among the fan-out wirings FL. As an example, the third angle 83 formed by one of the first dummy wirings 141 or the one of the second dummy wirings 151, and the second direction (e.g., the y direction), may be same as the second angle 82 formed by the second fan-out wiring FL2 located in the outermost portion among the fan-out wirings FL, and the second direction (e.g., the y direction).

The virtual extension lines VL extending along the center of each of the first dummy wirings 141, may be apart by the third distance d3 from each other in the first edge FAE1 of the fan-out area FA. The third distance d3 may be less than the first distance d1. The virtual extension lines VL extending along the center of each of the second dummy wirings 145, may be apart by the fourth distance d4 from each other in the second edge FAE2 of the fan-out area FA. The fourth distance d4 may be equal to or greater than the second distance d2. Though FIG. 8 shows the case where the third distance d3 is greater than the fourth distance d4, the third distance d3 may be approximately equal to the fourth distance d4 according to some embodiments.

The virtual extension lines VL respectively extending along the centers of the first dummy wirings 141, may respectively coincide or may not coincide with the virtual extension lines VL respectively extending along the centers of the second dummy wirings 151.

Figure 9:
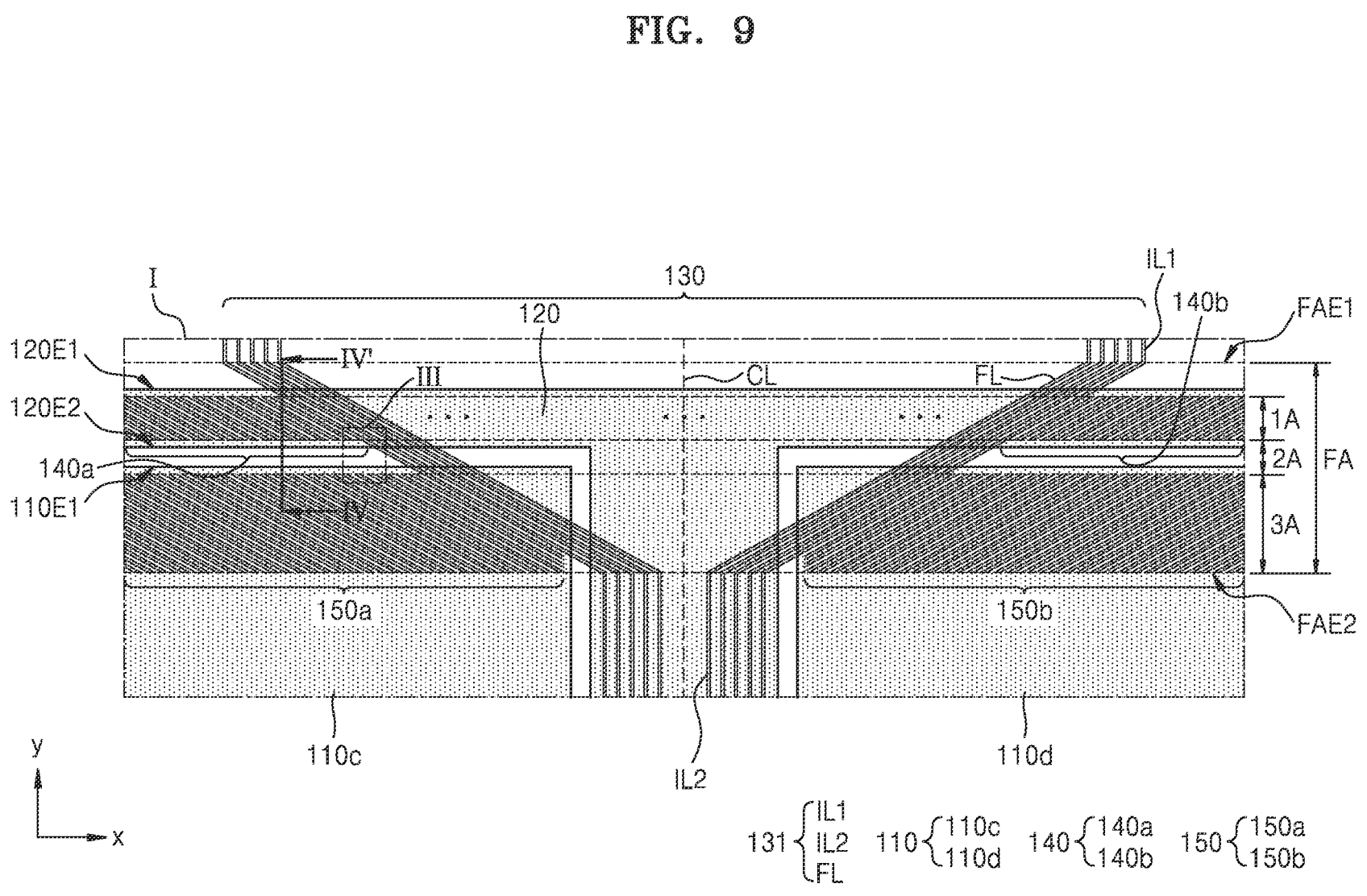
Figure 10:
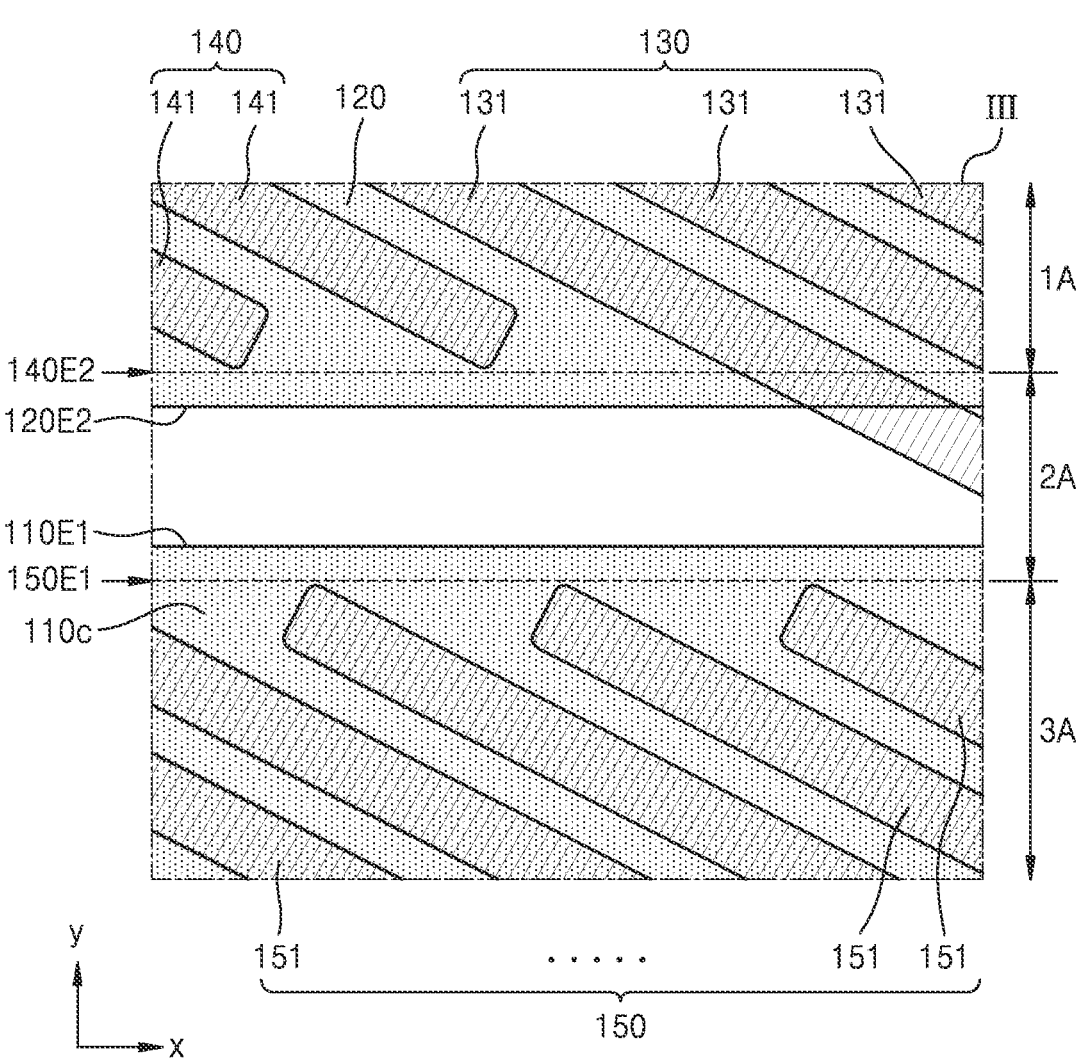
FIG. 10 is an enlarged plan view of a region III of FIG. 9 according to some embodiments.

FIG. 9 is a schematic plan view of the display apparatus according to some embodiments, and FIG. 10 is an enlarged plan view of a region III of FIG. 9.

FIG. 9 is an enlarged plan view of the region I of FIG. 5. FIG. 9 schematically shows the common voltage input unit 110, the driving voltage input unit 120, the signal wiring portion 130, the first dummy wiring portion 140, and the second dummy wiring portion 150, and omits other elements.

Referring to FIG. 9, when viewed in a direction approximately perpendicular to the display area DA (see FIG. 5), the signal wiring portion 130 may overlap the common voltage input unit 110 and the driving voltage input unit 120.

The driving voltage input unit 120 may include a horizontal portion and a vertical portion, wherein the horizontal portion extends in the first direction (e.g., the x direction), and the vertical portion having a center coinciding with the virtual center line CL passing through the center of the fan-out wirings FL, the vertical portion extending in the second direction (e.g., the y direction). According to some embodiments, the driving voltage input unit 120 may be arranged in a T-shape forming symmetry with respect to the virtual center line CL passing through the center of the fan-out wirings FL. The horizontal portion of the driving voltage input unit 120 may overlap the first area 1A. The fan-out wirings FL may overlap the driving voltage input unit 120 in the second edge FAE2 of the fan-out area FA.

When viewed in the direction approximately perpendicular to the display area DA (see FIG. 5), a first edge 120E1 of the driving voltage input unit 120 adjacent to the display area DA (see FIG. 5), may be located closer to the display area DA (see FIG. than an edge of the first area 1A adjacent to the display area DA (see FIG. 5), and a second edge 120E2 of the driving voltage input unit 120 adjacent to the pad PAD (see FIG. 5), may be located closer to the pad PAD (see FIG. 5) than an edge of the first area 1A adjacent to the pad PAD (see FIG. 5). With regard to this, it is shown in FIG. that the second edge 120E2 of the driving voltage input unit 120 is located in the second area 2A. Because the end of the first dummy wirings 141 is located in the second edge 140E2 of the first dummy wiring portion 140, the driving voltage input unit 120 may cover the end of the first dummy wirings 141. Accordingly, when viewed the direction approximately perpendicular to the display area DA (see FIG. 5), the first dummy wirings 141 do not protrude to the outside of the driving voltage input unit 120.

The third common voltage input unit 110c may be apart from the fourth common voltage input unit 110d with the driving voltage input unit 120 therebetween. The third common voltage input unit 110c and the fourth common voltage input unit 110d, may overlap the third area 3A. When viewed the direction approximately perpendicular to the display area DA (see FIG. 5), the first edge 110E1 of the third common voltage input unit 110c and the fourth common voltage input unit 110d that is adjacent to the display area DA (see FIG. 5), may be located closer to the display area DA (see FIG. 5) than an edge of the third area 3A that is adjacent to the display area DA (see FIG. 5). The edge of the third common voltage input unit 110c and the fourth common voltage input unit 110d that is adjacent to the pad PAD (see FIG. 5) may be located closer to the pad PAD (see FIG. 5) than the edge of the third area 3A that is adjacent to the pad PAD (see FIG. 5). The third common voltage input unit 110c and the fourth common voltage input unit 110d may be symmetrical with respect to the virtual center line CL passing through the center of the fan-out wiring FL. The edge of the third common voltage input unit 110c on the side of the center line CL, may be located closer to the center line CL than the edge of the (2-1)st dummy wiring portion 150a on the side of the center line CL. Likewise, the edge of the fourth common voltage input unit 110d on the side of the center line CL, may be located closer to the center line CL than the edge of the (2-2)nd dummy wiring portion 150b on the side of the center line CL. Accordingly, the (2-1)st dummy wiring portion 150a may be located inside the third common voltage input unit 110c, and the edges of the (2-1)st dummy wiring portion 150a may be covered by the third common voltage input unit 110c. The (2-2)nd dummy wiring portion 150b may be located inside the fourth common voltage input unit 110d, and the edges of the (2-2)nd dummy wiring portion 150b may be covered by the fourth common voltage input unit 110d. With regard to this, it is shown in FIG. 10 that the first edge 110E1 of the third common voltage input unit 110c is located in the second area 2A. Because the end of the second dummy wirings 151 is located in the first edge 150E1 of the second dummy wiring portion 150, the third common voltage input unit 110c may cover the end of the second dummy wirings 151. As described above, when viewed the direction approximately perpendicular to the display area DA (see FIG. 5), the second dummy wirings 151 may not protrude to the outside of the third common voltage input unit 110c and the fourth common voltage input unit 110d.

The fan-out wirings FL may cross a region between the driving voltage input unit 120, the third common voltage input unit 110c, and the fourth common voltage input unit 110d. In contrast, as described above, the first dummy wiring portion 140 may be located inside the driving voltage input unit 120, the (2-1)st dummy wiring portion 150a may be located inside the third common voltage input unit 110c, and the (2-2)nd dummy wiring portion 150b may be located inside the fourth common voltage input unit 110d. Accordingly, because the first dummy wiring portion 140 and the second dummy wiring portion 150 may not overlap a region between the driving voltage input unit 120, the third common voltage input unit 110c, and the fourth common voltage input unit 110d, the first dummy wiring 141 and the second dummy wiring 151 may be prevented from serving as short-circuit paths between different power wirings.

During automatic optical inspection, an inspection algorithm comparing regional images in the first direction (e.g., the x direction) and the second direction (e.g., the y direction) of the image, may be used. In this case, the inspection algorithm may have an issue of detecting a false error in a region where the fan-out wirings FL overlap the common voltage input unit 110 and the driving voltage input unit 120. Accordingly, according to embodiments, the false error may be reduced or prevented by arranging the first dummy wiring portion 140 and the second dummy wiring portion 150 that are arranged in a rule equal or similar to a rule in which the fan-out wirings FL are arranged.

Figure 11:
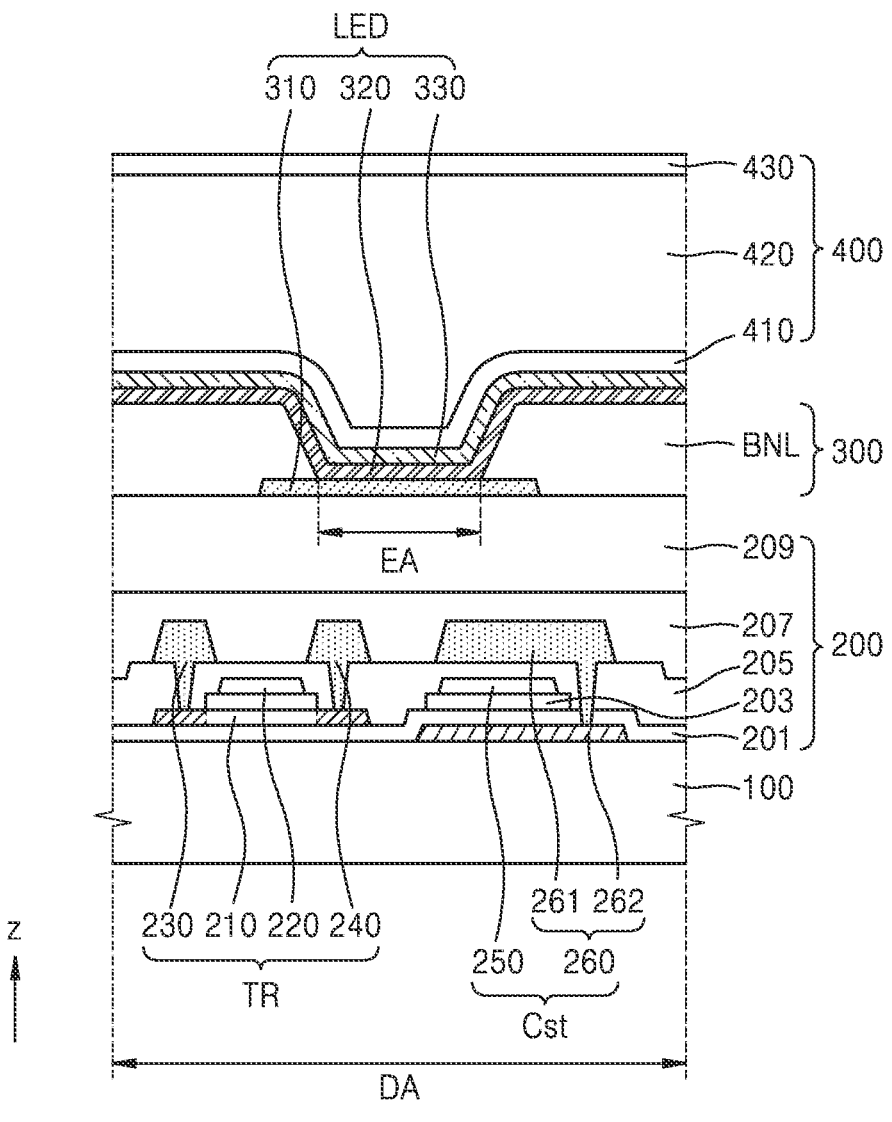
FIG. 11 is a schematic cross-sectional view of a portion of a display apparatus according to some embodiments.

FIG. 11 is a schematic cross-sectional view of a portion of a display apparatus according to some embodiments. FIG. 11 may be a cross-sectional view of a sub-pixel arranged in the display area DA.

Referring to FIG. 11, the substrate 100 may be located on the circuit layer 200, the light-emitting diode layer 300 including the light-emitting diode LED may be located on the circuit layer 200, and the light-emitting diode layer 300 may be sealed by the encapsulation layer 400.

The substrate 100 may include a material such as glass, metal, or an organic material. According to some embodiments, the substrate 100 may include a flexible material. As an example, the first substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a multi-layered structure including two layers each including the polymer resin, and a barrier layer including an inorganic material (such as silicon oxide, silicon nitride, silicon oxynitride, and amorphous silicon) therebetween. However, various modifications may be made.

A buffer layer 201 may be located on the substrate 100 and configured to prevent impurities from penetrating a transistor TR from the substrate 100. The buffer layer 201 may include an inorganic insulating material such as silicon oxide, silicon nitride, and/or silicon oxynitride.

A semiconductor layer 210 of the transistor TR is located on the buffer layer 201. The semiconductor layer 210 may include an oxide semiconductor. The oxide semiconductor may include indium gallium zinc oxide (IGZO), zinc tin oxide (ZTO), indium zinc oxide (IZO), and the like. According to some embodiments, the semiconductor layer 210 may include polycrystalline silicon, amorphous silicon, an organic semiconductor, or the like. The semiconductor layer 210 may include a channel region and conductive regions, wherein the channel region overlaps a gate electrode 220, and the conductive regions are located on two opposite sides of the channel region and doped or made conductive with impurities. One of the conductive regions may be a source region, and the other may correspond to a drain region.

The gate electrode 220 may overlap the channel region of the semiconductor layer 210 with a gate insulating layer 203 therebetween. The gate electrode 220 may include a conductive material including molybdenum (Mo), aluminum (Al), copper (Cu), and titanium (Ti) and have a single-layered structure or a multi-layered structure including the above materials. As shown in FIG. 11, the gate insulating layer 203 may be located in only a region overlapping the gate electrode 220 and a first capacitor electrode 250 described below. According to some embodiments, the gate electrode 220, the first capacitor electrode 250, and the gate insulating layer 203 may be formed by a successive etching process. In this case, only a portion of the gate insulating layer 203 that does not overlap the gate electrode 220 and the first capacitor electrode 250, may be etched. Accordingly, the gate insulating layer 203 may have a pattern equal or similar to the first capacitor electrode 250. The gate insulating layer 203 may have a shoulder structure protruding to the outside of each of the gate electrode 220 and the first capacitor electrode 250. The source region and the drain region of the semiconductor layer 210 may directly contact an interlayer insulating layer 205 as shown in FIG. 11. The gate insulating layer 203 may include an inorganic insulating material such as silicon oxide, silicon nitride, and/or silicon oxynitride.

A source electrode 230 and a drain electrode 240 may be located on the interlayer insulating layer 205 and may respectively directly contact the conductive region of the semiconductor layer 210. The interlayer insulating layer 205 may include an inorganic insulating material such as silicon oxide, silicon nitride, and/or silicon oxynitride.

A storage capacitor Cst may include at least two capacitor electrodes. According to some embodiments, it is shown in FIG. 11 that the storage capacitor Cst includes a first capacitor electrode 250 and a second capacitor electrode 260, wherein the second capacitor electrode 260 includes first and second sub-capacitor electrodes 261 and 262 located on different layers. The first and second sub-capacitor electrodes 261 and 262 may each overlap the first capacitor electrode 250. Though it is shown in FIG. 7 that the second capacitor electrode 260 includes first and second sub-capacitor electrodes 261 and 262, one of the first and second sub-capacitor electrodes 261 and 262 may be omitted according to some embodiments. The first sub-capacitor electrode 261 may be arranged over the first capacitor electrode 250. The second sub-capacitor electrode 262 may be located below the first capacitor electrode 250. As shown in FIG. 11, the first sub-capacitor electrode 261 may be electrically connected to the second sub-capacitor electrode 262 through a contact hole passing through insulating layers (e.g., the buffer layer 201 and the interlayer insulating layer 205) located therebetween. An inorganic protective layer 207 may be formed on the transistor TR and the storage capacitor Cst. The inorganic protective layer 207 may include an inorganic insulating material such as silicon oxide, silicon nitride, and/or silicon oxynitride.

The organic insulating layer 209 may include an organic insulating material such as acryl, benzocyclobutene (BCB), polyimide, or hexamethyldisiloxane (HMDSO).

The light-emitting diode LED may include a first electrode 310, an emission layer 320, and a second electrode 330. The light-emitting diode LED may be one of the first light-emitting diode LED1 of the red sub-pixel Pr, the second light-emitting diode LED2 of the green sub-pixel Pg, and the third light-emitting diode of the blue sub-pixel Pb described with reference to FIG. 2.

The first electrode 310 may include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the first electrode 310 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. According to some embodiments, the first electrode 310 may further include a layer on/under the reflective layer, the layer including ITO, IZO, ZnO, or $In_2O_3$. As an example, the first electrode 310 may have a three-layered structure of an ITO layer, an Ag layer, and an ITO layer.

A bank layer BNL may be located on the first electrode 310 and may cover the edges of the first electrode 310. The bank layer BNL may include an opening that overlaps a portion of the first electrode 310, and the opening may expose a portion of the first electrode 310. The opening may define an emission area EA of the light-emitting diode LED. As an example, the width of the opening may correspond to the width of the emission area EA. The bank layer BNL may include an organic material. The bank layer BNL may include a light-blocking material and be formed in black. The light-blocking material may include carbon black, carbon nanotubes, a resin or paste including black dye, metal particles, for example, nickel (Ni), aluminum (Al), molybdenum (Mo), and an alloy thereof, metal oxide particles (e.g., chrome oxide) or metal nitride particles (e.g., chrome nitride).

The emission layer 320 may be arranged to correspond to the emission area EA. As an example, the emission layer 320 may be located inside the opening of the bank layer BNL. According to some embodiments, a functional layer(s) may be located under and/or on the emission layer 320. The functional layer(s) may include a hole injection layer (HIL), a hole transport layer (HTL), an electron transport layer (ETL), and/or an electron injection layer (EIL). As described with reference to FIG. 5, the emission layer 320 may be formed to cover the display area DA entirely, and, like the emission layer 320, the functional layer(s) may be located between the first electrode 310 and the second electrode 330, and formed to cover the display area DA entirely.

The second electrode 330 may include a conductive material having a low work function. As an example, the second electrode 330 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. Alternatively, the second electrode 330 may further include a layer on the (semi) transparent layer, the layer including ITO, IZO, ZnO, or $In_2O_3$.

The encapsulation layer 400 may be located on the second electrode 330. The encapsulation layer 400 may include at least one inorganic encapsulation layer and at least one organic encapsulation layer. With regard to this, it is shown in FIG. 11 that the encapsulation layer 400 includes a first inorganic encapsulation layer 410, an organic encapsulation layer 420, and a second inorganic encapsulation layer 430.

The first inorganic encapsulation layer 410 may include an inorganic insulating material such as silicon oxide, silicon nitride, and/or silicon oxynitride. When needed, a capping layer and an LiF layer may be located between the first inorganic encapsulation layer 410 and the second electrode 330, wherein the capping layer includes an organic insulating material and/or an inorganic insulating material.

The organic encapsulation layer 420 may be formed by coating monomer and then curing the same. To control flowing of the monomer, a plurality of partition walls may be arranged in the non-display area NDA (see FIG. 1).

The organic encapsulation layer 420 may include at least one material among polyethylene terephthalate, polyethylene naphthalate, polycarbonate, polyimide, polyethylene sulfonate, polyoxymethylene, and polyarylate, hexamethyldisiloxane. The second inorganic encapsulation layer 430 may cover the organic encapsulation layer 420 and include an inorganic insulating material such as silicon oxide, silicon nitride, and/or silicon oxynitride.

Figure 12:
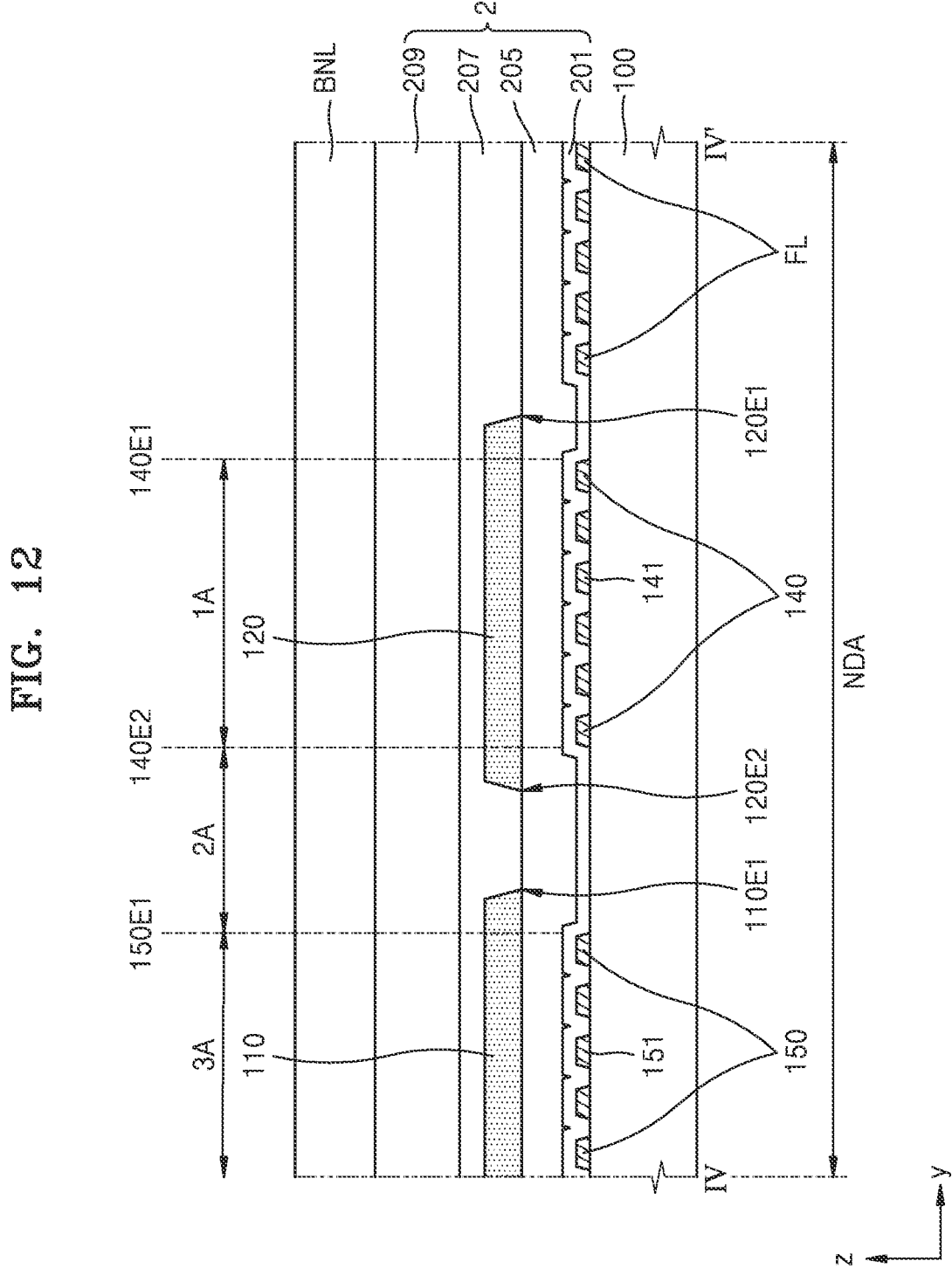
FIGS. 12 and 13 are schematic cross-sectional views of a portion of a display apparatus according to some embodiments.
Figure 13:
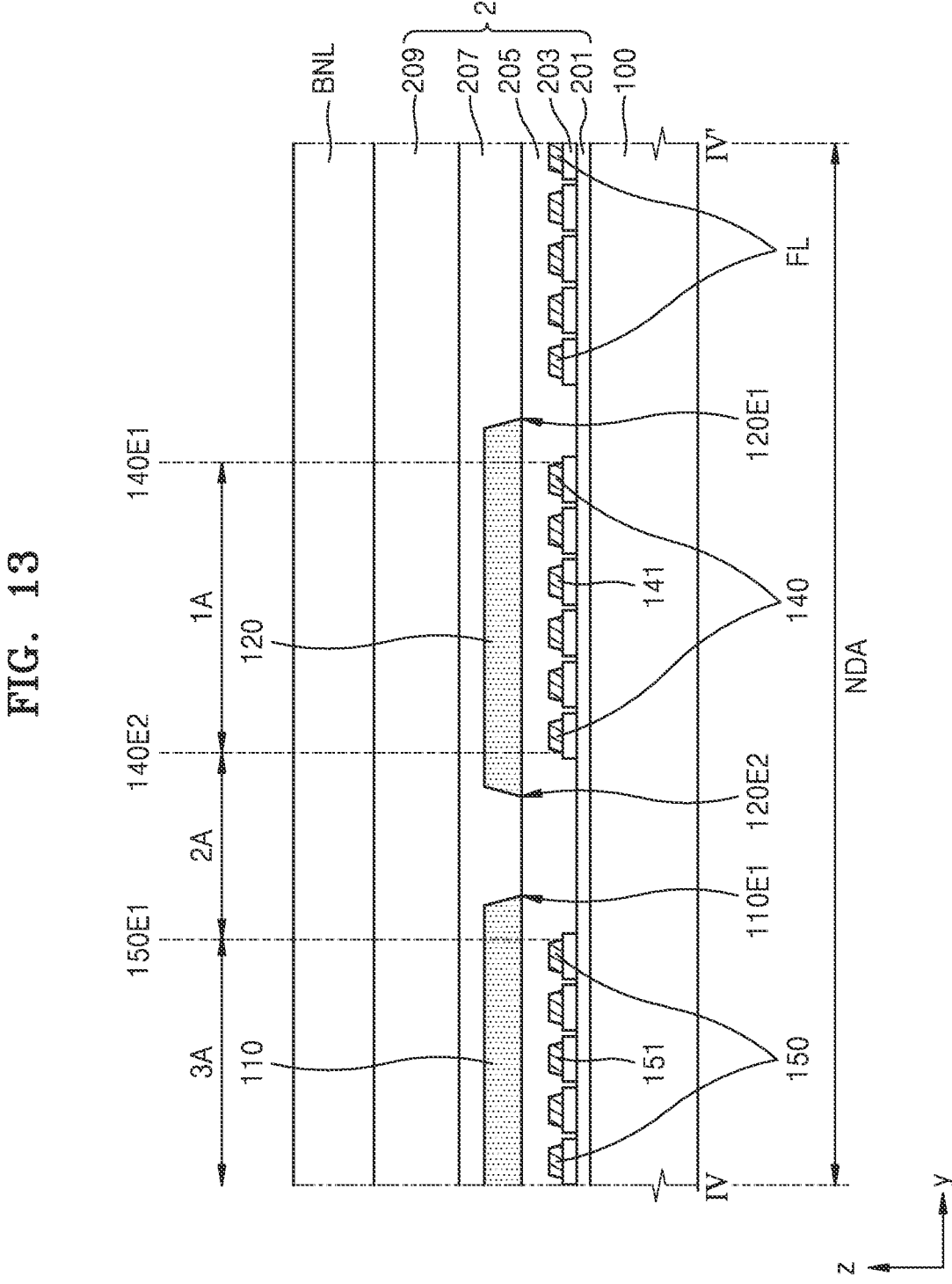

FIGS. 12 and 13 are schematic cross-sectional views of a portion of a display apparatus according to some embodiments. FIGS. 12 and 13 show a cross-section of the display apparatus, taken along the line IV-IV' of FIG. 9 according to different embodiments.

Referring to FIG. 12, the fan-out wirings FL, the first dummy wirings 141, and the second dummy wirings 151 may be located between the substrate 100 and the buffer layer 201. As an example, the fan-out wirings FL, the first dummy wirings 141, and the second dummy wirings 151, may be located on the same layer as the second sub-capacitor electrode 262 (see FIG. 11) of the storage capacitor Cst (see FIG. 11). The fan-out wirings FL, the first dummy wirings 141, and the second dummy wirings 151, may include the same material as the material of the second sub-capacitor electrode 262 (see FIG. 11) of the storage capacitor Cst (see FIG. 11). The buffer layer 201 may be located on the substrate 100 to cover the fan-out wirings FL, the first dummy wirings 141, and the second dummy wirings 151. The interlayer insulating layer 205, the inorganic protective layer 207, the organic insulating layer 209 and the bank layer BNL may be sequentially stacked on the buffer layer 201.

According to some embodiments, as shown in FIG. 13, the buffer layer 201, the gate insulating layer 203, and the interlayer insulating layer 205 may be sequentially stacked on the substrate 100. The fan-out wirings FL, the first dummy wirings 141, and the second dummy wirings 151 may be located between the gate insulating layer 203 and the interlayer insulating layer 205. As an example, the fan-out wirings FL, the first dummy wirings 141, and the second dummy wirings 151, may be located on the same layer as the gate electrode 220 (see FIG. 11) of the transistor TR (see FIG. 11). The fan-out wirings FL, the first dummy wirings 141, and the second dummy wirings 151, may include the same material as the material of the gate electrode 220 (see FIG. 11) of the transistor TR (see FIG. 11).

The gate insulating layer 203 may be located in only a region overlapping the fan-out wirings FL, the first dummy wirings 141, and the second dummy wirings 151. According to some embodiments, the gate insulating layer 203 may be formed simultaneously with the fan-out wirings FL, the first dummy wirings 141, and the second dummy wirings 151, or formed by a successive etching process. In this case, the gate insulating layer 203 may have a pattern equal or similar to the pattern of the fan-out wirings FL, the first dummy wirings 141, and the second dummy wirings 151. The gate insulating layer 203 may have a shoulder structure protruding to the outside of each of the fan-out wirings FL, the first dummy wirings 141, and the second dummy wirings 151.

According to some embodiments, the fan-out wirings FL, the first dummy wirings 141, and the second dummy wirings 151 may each include an upper wiring and a lower wiring, wherein the upper wiring is located between the gate insulating layer 203 and the interlayer insulating layer 205, and the lower wiring is located between the substrate 100 and the buffer layer 201.

The common voltage input unit 110 and the driving voltage input unit 120 may be located between the interlayer insulating layer 205 and the inorganic protective layer 207. The common voltage input unit 110 and the driving voltage input unit 120 may be located on the same layer as the source electrode 230 (see FIG. 11) and the drain electrode 240 (see FIG. 11) of the transistor TR (see FIG. 11). The common voltage input unit 110 and the driving voltage input unit 120 may include the same material as the material of the source electrode 230 (see FIG. 11) and the drain electrode 240 (see FIG. 11) of the transistor TR (see FIG. 11).

The buffer layer 201, the interlayer insulating layer 205, the inorganic protective layer 207, the organic insulating layer 209, and the bank layer BNL may be integrally formed over the entire surface of the substrate 100 to extend from the display area DA (see FIG. 5) to the non-display area NDA.

As described above, the first area 1A may be defined as a region between a first edge 140E1 and a second edge 140E2 of the first dummy wiring portion 140. In the first area 1A, the first dummy wiring portion 140 may be arranged to overlap the driving voltage input unit 120. The first dummy wiring portion 140 may include the plurality of first dummy wirings 141 apart from each other. The third area 3A may be defined as a region between the first edge 150E1 and the second edge 150E2 (see FIG. 7) of the second dummy wiring portion 150. In the third area 3A, the second dummy wiring portion 150 may be arranged to overlap the common voltage input unit 110. The second dummy wiring portion 150 may include the plurality of second dummy wirings 151 apart from each other.

The first edge 110E1 of the common voltage input unit 110 may be apart in the second direction (e.g., the y direction) from the first edge 150E1 of the second dummy wiring portion 150. Accordingly, when viewed in the direction approximately perpendicular to the display area DA (see FIG. 5), the second dummy wiring portion 150 may not protrude to the outside of the common voltage input unit 110.

The first edge 120E1 of the driving voltage input unit 120 may be apart in the second direction (e.g., the y direction) from the first edge 140E1 of the first dummy wiring portion 140, and the second edge 120E2 of the driving voltage input unit 120 may be apart in the opposite direction (e.g., a −y direction) to the second direction from the second edge 140E2 of the first dummy wiring portion 140. Accordingly, when viewed in the direction approximately perpendicular to the display area DA (see FIG. 5), the first dummy wiring portion 140 may not protrude to the outside of the driving voltage input unit 120.

Figure 14:
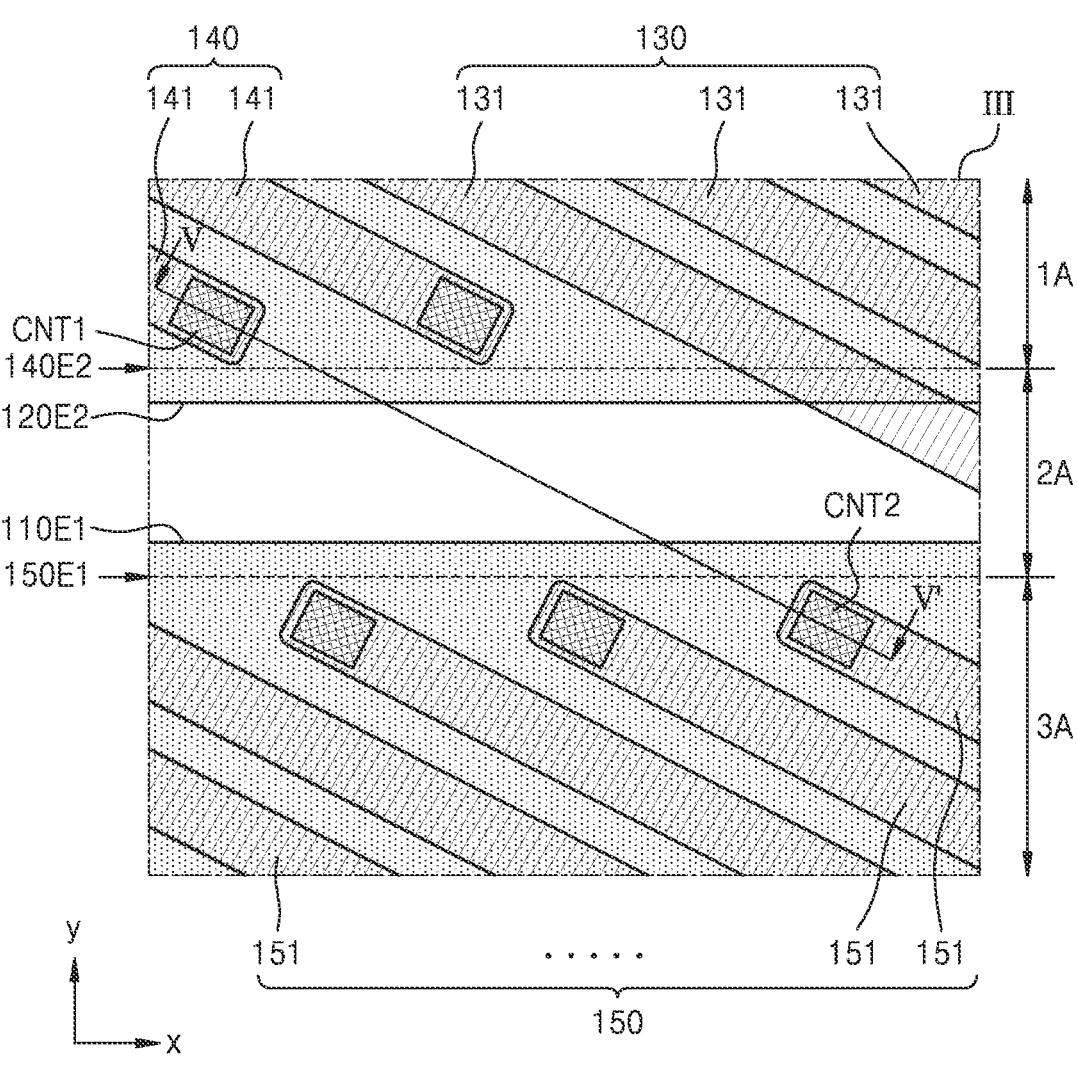
FIG. 14 is a schematic plan view of a display apparatus according to some embodiments.
Figure 15:
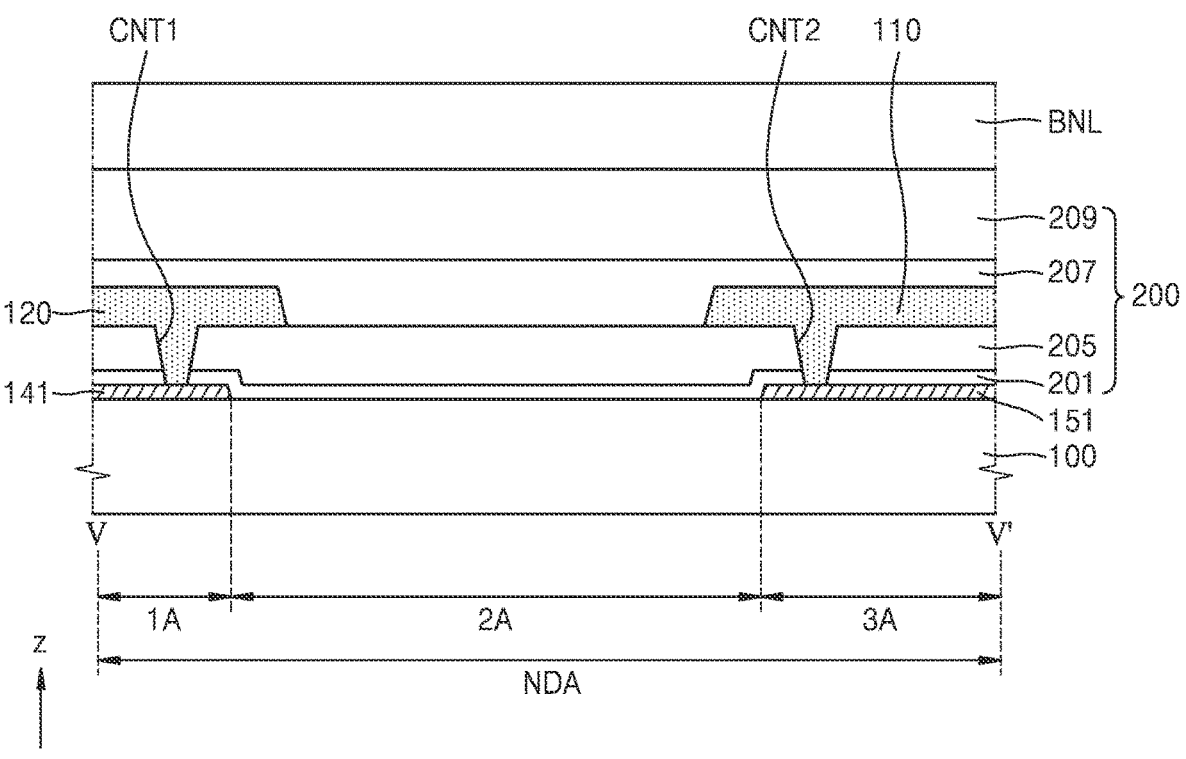
FIG. 15 is a schematic cross-sectional view of the display apparatus of FIG. 14, taken along the line V-V' of FIG. 14 according to some embodiments.

FIG. 14 is a schematic plan view of the display apparatus according to some embodiments, and FIG. 15 is a schematic cross-sectional view of the display apparatus, taken along the line V-V' of FIG. 14. FIG. 14 is similar to FIG. 10 but different from FIG. 10 in that first contact portions CNT1 are located on two opposite sides of each of the first dummy wirings 141, and second contact portions CNT2 are located on two opposite sides of each of the second dummy wirings 141. Hereinafter, repeated description of the same element is omitted, and differences are mainly described.

Referring to FIGS. 14 and 15, the first contact portion CNT1 may be located in the end of each of the first dummy wirings 141. The driving voltage input unit 120 may be electrically connected to the first dummy wiring 141 through contact holes respectively passing through the buffer layer 201 and the interlayer insulating layer 205 located between the first dummy wiring 141 and the driving voltage input unit 120 in the first contact portion CNT1. Though it is shown in FIG. 15 that the driving voltage input unit 120 directly contacts the first dummy wiring 141, a connection electrode connecting the driving voltage input unit 120 to the first dummy wiring 141 may be further provided according to some embodiments.

The second contact portion CNT2 may be located in the end of each of the second dummy wiring 151. The common voltage input unit 110 may be electrically connected to the second dummy wiring 151 through contact holes respectively passing through the buffer layer 201 and the interlayer insulating layer 205 located between the second dummy wiring 151 and the common voltage input unit 110 in the second contact portion CNT2. Like the first contact portion CNT1, a connection electrode connecting the common voltage input unit 110 to the second dummy wiring 151 in the second contact portion CNT2, may be further provided.

Though it is shown in FIGS. 14 and 15 that the first dummy wiring 141 and the second dummy wiring 151 are located between the substrate 100 and the buffer layer 201, the first dummy wiring 141 and the second dummy wiring 151 may be located between the gate insulating layer 203 and the interlayer insulating layer 205 in some embodiments as shown in FIG. 13. In this case, the driving voltage input unit 120 may be electrically connected to the first dummy wiring 141 through a contact hole passing through the interlayer insulating layer 205 in the first contact portion CNT1, and the second dummy wiring 151 may be electrically connected to the common voltage input unit 110 through a contact hole passing through the interlayer insulating layer 205 in the second contact portion CNT2.

In the case where the first dummy wirings 141 of the first dummy wiring portion 140, and the second dummy wirings 151 of the second dummy wiring portion 150, are electrically insulated from other elements and floated, the first dummy wirings 141 and the second dummy wirings 151 may be charged with static electricity, and unexpected damage to the substrate 100 may occur. Accordingly, the first dummy wirings 141 may be prevented from being charged with static electricity by electrically connecting the first dummy wirings 141 to the driving voltage input unit 120. In addition, because the first dummy wirings 141 serve as a portion of the driving voltage input unit 120, a resistance of the driving voltage input unit 120 may be reduced. Likewise, the second dummy wirings 151 may be prevented from being charged with static electricity by electrically connecting the second dummy wirings 151 to the common voltage input unit 110. In addition, because the second dummy wirings 151 serve as a portion of the common voltage input unit 110, a resistance of the common voltage input unit 110 may be reduced.

According to some embodiments, a detection error occurring in an automatic optical inspection operation may be reduced without adding a separate process. However, the scope of embodiments according to the present disclosure are not limited by these characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
a substrate including a display area and a peripheral area outside the display area;
a driving voltage input unit in the peripheral area;
a common voltage input unit in the peripheral area and spaced apart from the driving voltage input unit;
a signal wiring portion including a plurality of fan-out wirings that overlap the driving voltage input unit and the common voltage input unit;
a first dummy wiring portion outside the signal wiring portion and including a plurality of first dummy wirings that overlap the driving voltage input unit; and
a second dummy wiring portion outside the signal wiring portion and including a plurality of second dummy wirings that overlap the common voltage input unit.

2. The display apparatus of claim 1, wherein the first dummy wiring portion is spaced apart from the second dummy wiring portion.

3. The display apparatus of claim 1, wherein in a plan view, the first dummy wiring portion is inside the driving voltage input unit.

4. The display apparatus of claim 1, wherein in a plan view, the second dummy wiring portion is inside the common voltage input unit.

5. The display apparatus of claim 1, wherein the plurality of fan-out wirings are in a fan-out area,
wherein the plurality of fan-out wirings are spaced apart from each other with a first interval at a first edge of the fan-out area adjacent to the display area, and are spaced apart from each other with a second interval at a second edge facing the first edge, and
wherein the first interval is greater than the second interval.

6. The display apparatus of claim 5, wherein virtual extension lines respectively extending from the plurality of first dummy wirings are spaced apart from each other with the first interval at the first edge of the fan-out area, and are spaced apart from each other with the second interval at the second edge.

7. The display apparatus of claim 5, wherein virtual extension lines respectively extending from the plurality of second dummy wirings are spaced apart from each other with the first interval at the first edge of the fan-out area, and are spaced apart from each other with the second interval at the second edge.

8. The display apparatus of claim 5, wherein virtual extension lines respectively extending from the plurality of first dummy wirings are parallel to a fan-out wiring in an outermost portion among the plurality of fan-out wirings.

9. The display apparatus of claim 8, wherein virtual extension lines respectively extending from the plurality of first dummy wirings are spaced apart from each other with an interval equal to or less than the first interval at the first edge of the fan-out area.

10. The display apparatus of claim 5, wherein virtual extension lines respectively extending from the plurality of second dummy wirings are parallel to a fan-out wiring in an outermost portion among the plurality of fan-out wirings.

11. The display apparatus of claim 10, wherein virtual extension lines respectively extending from the plurality of second dummy wirings are spaced apart from each other with an interval equal to or greater than the second interval at the second edge of the fan-out area.

12. The display apparatus of claim 1, further comprising:
a semiconductor layer in the display area; and
a buffer layer under the semiconductor layer,
wherein the first dummy wiring portion and the second dummy wiring portion are between the substrate and the buffer layer.

13. The display apparatus of claim 1, further comprising:
a semiconductor layer in the display area;
a gate insulating layer on the semiconductor layer; and
an interlayer insulating layer on the gate insulating layer,
wherein the first dummy wiring portion and the second dummy wiring portion are between the gate insulating layer and the interlayer insulating layer.

14. The display apparatus of claim 1, wherein the first dummy wiring is electrically connected to the driving voltage input unit.

15. The display apparatus of claim 14, wherein the first dummy wiring includes contact portions on two opposite ends thereof, the contact portions being electrically connected to the driving voltage input unit.

16. The display apparatus of claim 1, wherein the second dummy wiring is electrically connected to the common voltage input unit.

17. The display apparatus of claim 16, wherein the second dummy wiring includes contact portions on two opposite ends thereof, the contact portions being electrically connected to the driving voltage input unit.

18. The display apparatus of claim 1, wherein the driving voltage input unit and the common voltage input unit are each provided in plurality, the plurality of driving voltage input units and the plurality of common voltage input units being alternately arranged in a first direction.

19. The display apparatus of claim 18, wherein the first dummy wiring portion includes a (1-1)st dummy wiring portion and a (1-2)nd dummy wiring portion that are symmetrical to each other with respect to a central line of the driving voltage input unit extending in a second direction crossing the first direction.

20. The display apparatus of claim 18, wherein the second dummy wiring portion includes a (2-1)st dummy wiring portion and a (2-2)nd dummy wiring portion that are symmetrical to each other with respect to a central line of the driving voltage input unit extending in a second direction crossing the first direction.

* * * * *